(12) United States Patent
Sekiya

(10) Patent No.: US 7,380,690 B2
(45) Date of Patent: Jun. 3, 2008

(54) SOLUTION JET TYPE FABRICATION APPARATUS, METHOD, SOLUTION CONTAINING FINE PARTICLES, WIRING PATTERN SUBSTRATE, DEVICE SUBSTRATE

(75) Inventor: Takuro Sekiya, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 533 days.

(21) Appl. No.: 10/758,398

(22) Filed: Jan. 15, 2004

(65) Prior Publication Data

US 2004/0201648 A1    Oct. 14, 2004

(30) Foreign Application Priority Data

| Jan. 17, 2003 | (JP) | ............................. 2003-009108 |
| Jan. 17, 2003 | (JP) | ............................. 2003-009186 |
| Nov. 28, 2003 | (JP) | ............................. 2003-399572 |

(51) Int. Cl.
   *B41J 2/06* (2006.01)
(52) U.S. Cl. .......................... 222/594; 222/591; 347/47
(58) Field of Classification Search ................ 222/591, 222/594, 597; 347/47, 45, 100
See application file for complete search history.

(56) References Cited

U.S. PATENT DOCUMENTS

| 3,298,030 A | 1/1967 | Lewis et al. |
| 3,596,275 A | 7/1971 | Sweet |
| 3,683,212 A | 8/1972 | Zoltan |
| 3,747,120 A | 7/1973 | Semme |
| 3,946,398 A | 3/1976 | Kyser et al. |
| 4,504,844 A | 3/1985 | Ebi et al. |
| 4,510,509 A | 4/1985 | Horike et al. |
| 4,631,553 A | 12/1986 | Sekiya |
| 4,990,939 A | 2/1991 | Sekiya et al. |

(Continued)

FOREIGN PATENT DOCUMENTS

JP    54-51837    4/1979

(Continued)

OTHER PUBLICATIONS

"Cadmium Sulfide of Small Dimensions Produced in Inverted Micelles", Lianos, P. et al., Chemical Physics Letters, vol. 125 No. 3, Dec. 1986.

(Continued)

*Primary Examiner*—Scott Kastler
(74) *Attorney, Agent, or Firm*—Cooper & Dunham, LLP

(57) ABSTRACT

A solution jet type fabrication apparatus for fabricating a wiring pattern or a device, the solution jet type fabrication apparatus including a jet head for ejecting a droplet of a solution containing fine particles onto a substrate, so as to form a pattern, by vaporizing a volatile ingredient of the solution, and allowing a solid component to remain on the substrate, wherein the substrate has no liquid absorbing property, wherein the jet head includes a nozzle from which the droplet is ejected, the nozzle being formed from a material that has a greater hardness than that of the fine particles in the solution, wherein the nozzle has a size that is equal to or less than $\Phi 20$ μm, the nozzle satisfying a relation of $0.0001 \leq Dp/Do \leq 0.01$, where Dp represents the diameter of each of the fine particles and Do represents the diameter of the nozzle, wherein each of the fine particles has a size that is equal to or less than the roughness of a surface of the substrate.

14 Claims, 24 Drawing Sheets

U.S. PATENT DOCUMENTS

| | | | |
|---|---|---|---|
| 5,172,139 A | 12/1992 | Sekiya et al. |
| 5,293,182 A | 3/1994 | Sekiya et al. |
| 5,389,962 A | 2/1995 | Sekiya et al. |
| 5,412,413 A | 5/1995 | Sekiya et al. |
| 5,420,618 A | 5/1995 | Sekiya et al. |
| 5,600,356 A | 2/1997 | Sekiya et al. |
| 5,610,637 A | 3/1997 | Sekiya et al. |
| 5,657,060 A | 8/1997 | Sekiya et al. |
| 5,729,257 A | 3/1998 | Sekiya et al. |
| 5,754,202 A | 5/1998 | Sekiya et al. |
| 5,877,786 A | 3/1999 | Sekiya et al. |
| 6,039,425 A | 3/2000 | Sekiya et al. |
| 6,193,348 B1 | 2/2001 | Sekiya et al. |
| 6,227,639 B1 | 5/2001 | Sekiya et al. |
| 6,338,545 B1 | 1/2002 | Sekiya |
| 6,554,401 B2 | 4/2003 | Sekiya |
| 6,568,778 B1 | 5/2003 | Sekiya et al. |
| 6,598,959 B2 | 7/2003 | Sekiya |
| 2001/0024227 A1 | 9/2001 | Sekiya |
| 2002/0075353 A1 | 6/2002 | Sekiya |
| 2003/0016269 A1 | 1/2003 | Sekiya |
| 2003/0053501 A1 | 3/2003 | Sekiya et al. |

FOREIGN PATENT DOCUMENTS

| | | | |
|---|---|---|---|
| JP | 6-344560 | 12/1994 | |
| JP | 9-320363 | 12/1997 | |
| JP | 10-204350 | 8/1998 | |
| JP | 2000-126681 | 5/2000 | |
| JP | 2000-251674 | 9/2000 | |
| JP | 2001-68827 | 3/2001 | |
| JP | 2001-319567 | 11/2001 | |
| JP | 2002-134878 | 5/2002 | |
| JP | 02002263530 A | * | 9/2002 |

OTHER PUBLICATIONS

"Epitaxial Growth of Highly Luminescent CdSe/CdS Core/Shell Nanocrystals with Photostability and Electronic Accessibility", Peng, X. et al., J. Am. Chem. Soc., 119, Apr. 1997.

Xiaogang Peng et al. (1997), "Epitaxial Growth of Highly Luminescent CdSe/CdS Core/Shell Nanocrystals with Photostability and Electronic Accessiblity", J. Am. Chem. Soc., 119, pp. 7019-7029.

Aug. 30, 2005 Japanese Office Action in connection with Japanese Application No. 2003-009186 which corresponds to the above-identified application.

* cited by examiner

FIG.4A
FIG.4B
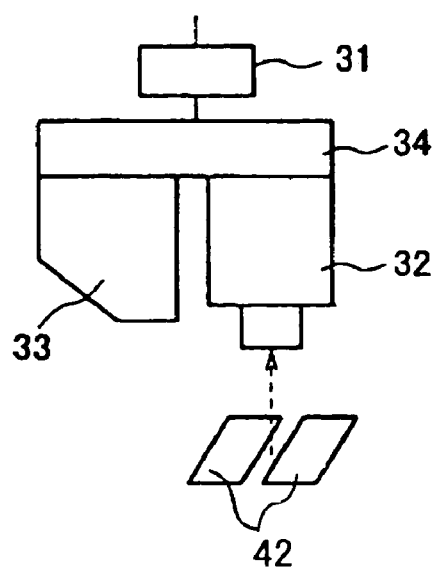
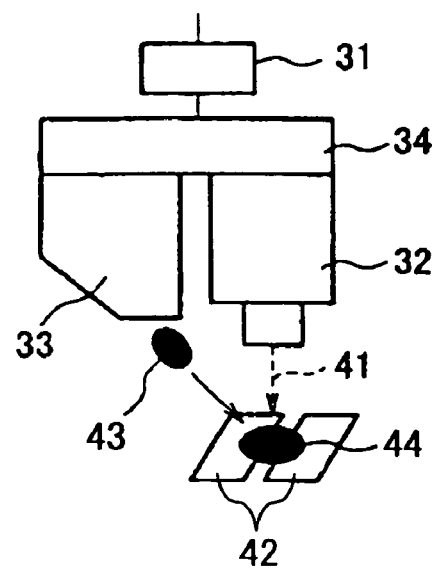

JET DIRECTION

JET DIRECTION

JET DIRECTION

SOLUTION JET TYPE FABRICATION APPARATUS, METHOD, SOLUTION CONTAINING FINE PARTICLES, WIRING PATTERN SUBSTRATE, DEVICE SUBSTRATE

BACKGROUND OF THE INVENTION

1. Field of the Invention

The present invention generally relates to an apparatus and method for forming wiring substrates and device substrates by using a jet unit that jets materials containing fine particles and performs pattern formation, a material used for the apparatus, and the wiring substrates and devices formed by the apparatus.

2. Description of the Related Art

In recent years, various elements of light emitting devices/media and light processing device/media using minute fine particles/ultra fine particles have been studied. In order to apply fine particles to various devices, high density integration obtained by depositing films or layers that include fine particle material on a solid substrate is important. Thin films being integrated with fine particles in high density are disclosed in, for example, Light Emitting Device (Alivisatos et al.), Photoelectric Transfer Device (Greenham, N. C., et al., Phys. Rev. B, 54, 17628 (1996)), Ultra High-Speed Detector (Bhargava), Electroluminescence Display and Panel (Bhargava, Alivisatos et al.), Nanostructure Memory Device (Chen et al.), Multicolor Device from Nano particle alignment (Dushkin et al.).

Meanwhile, as for methods for forming thin films of inorganic compounds with excellent orientation, there are, for example, a molecular beam epitaxy method (MBE), a cluster ion beam method, an ion beam irradiation vacuum deposition method, a chemical vapor deposition method (CVD), a physical vapor deposition method (PVD), and a liquid phase epitaxy method (LPE). As for a method of forming thin films of organic compounds, there is, for example, a Langmuir Blow jet method (LB method). Quantum particles may be obtained by allowing materials sublimed in high vacuum with a vacuum apparatus (e.g. MBE) to form particles on a solid substrate in a self-organized manner.

The foregoing methods, however, has difficulty in controlling space between particles or size distribution of particles, and requires large cost for obtaining a desired structure. Therefore, in order to solve such problems, liquid jet techniques, that is, techniques of forming a film of a material including fine particles by using liquid jet head are being proposed. For example, in Japanese Patent Laid-Open Application No. 2000-126681, an emulsion including nanoparticles is coated on a solid substrate by an inkjet coating technique, to thereby form a thin film formed of an ultra fine particle (nanoparticle) aggregate, in which the thin film provides a function of increasing or memorizing photoluminescence strength as a function of the time or amount of irradiation of excitation light.

Other than applying the liquid jet technique to functional devices, the liquid jet technique may also be employed for fabricating circuit boards. Some examples of conventional known methods for fabricating circuit boards are described below.

(1) A method of forming a copper wiring pattern in which the copper wiring pattern is formed where a copper-clad laminate is covered with resist, is then exposed to form a circuit pattern with a photolithographic method, is then dissolved for removing unexposed resist, and is then etched at its resist-removed portions.

(2) A method of forming a conductive pattern in which the conductive pattern is formed where a ceramic substrate is applied with a conductive paste for printing a desired circuit pattern by using a screen printing technique, and is then thermally processed in a nonoxide atmosphere for sintering metal fine particles in the conductive paste.

(3) A method of forming a copper wiring pattern in which the copper wiring pattern is formed where an insulating substrate, being formed with a thin conductive layer by deposition of conductive metal, is covered with resist, is then exposed to form a circuit pattern with a photolithographic method, is then dissolved for removing unexposed resist, and is then etched at its resist-removed portions.

Nevertheless, the foregoing conventional known methods are not suited for forming fine patterns. Therefore, a method of employing an ink jet technique (principle) is proposed. As an example of a method of forming wiring patterns and fabricating circuit boards by employing an ink jet technique, in Japanese Patent Laid-Open Application No.2002-134878, a circuit pattern is directly drawn onto a substrate with a metal paste. This method provides easy formation of fine patterns with a simple fabrication process, has no necessity of waste fluid disposal, and requires little manufacture cost.

Meanwhile, the inventor of the present invention also has disclosed a method of fabricating an electronic source substrate by employing an ink jet technique (principle) in Japanese Patent Laid Open Application No.2001-319567.

Although various proposals are made using the ink jet technique, applying the technique for forming various devices and substrate patterns is a new technology still having many undiscovered areas. In addition, unlike a case of applying ink to paper with an inkjet technique, there are still many problems to solve in a case of forming patterns on unabsorbent substrates.

SUMMARY OF THE INVENTION

It is a general object of the present invention to provide a solution jet type fabrication apparatus, a method, a solution containing fine particles, a wiring pattern substrate, a device substrate, and a fabrication method that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a solution jet type fabrication apparatus, a solution containing fine particles, a wiring pattern substrate, a device substrate, and a fabrication method particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a solution jet type fabrication apparatus for fabricating a wiring pattern or a device, the solution jet type fabrication apparatus including: a jet head for ejecting a droplet of a solution containing fine particles onto a substrate, so as to form a pattern, by vaporizing a volatile ingredient of the solution, and allowing a solid component to remain on the substrate, wherein the substrate has no liquid absorbing property, wherein the jet head includes a nozzle from which the droplet is ejected, the nozzle being formed from a material that has a greater hardness than that of the fine particles in the solution, wherein the nozzle has a size that is equal to or less than $\Phi 20$ μm, the nozzle satisfying a relation of $0.0001 \leq Dp/Do \leq 0.01$, where Dp represents the diameter of each of the fine particles and Do represents the diameter of the nozzle, wherein each of the fine particles has a size that is equal to or less than the roughness of a surface of the substrate.

In the solution jet type fabrication apparatus according to the present invention, the jet head may eject the droplet using a mechanical displacement force.

In the solution jet type fabrication apparatus according to the present invention, the jet head may eject the droplet using the mechanical displacement force so that the droplet becomes spherical immediately before the droplet reaches the substrate.

In the solution jet type fabrication apparatus according to the present invention, the jet head may eject the droplet using the mechanical displacement force so that the droplet has an elongated shape along the ejecting direction without a trailing droplet, and so that the length of the elongated droplet in the ejecting direction is no more than three times the length of the elongated droplet in a direction perpendicular to the ejecting direction.

In the solution jet type fabrication apparatus according to the present invention, the distance between the substrate and the nozzle may be 3 mm or less.

In the solution jet type fabrication apparatus according to the present invention, the solution jet type fabrication apparatus may further include: a driving unit that moves at least one of the jet head and the substrate relatively to the other.

In the solution jet type fabrication apparatus according to the present invention, the velocity of the relative movement of the jet head and the substrate may be less than the velocity of the ejected droplet.

In the solution jet type fabrication apparatus according to the present invention, the jet head may eject the droplet using a growth displacement force of a thermally generated bubble.

In the solution jet type fabrication apparatus according to the present invention, the solution jet type fabrication apparatus may further include: a driving unit that moves at least one of the jet head and the substrate relatively to the other.

In the solution jet type fabrication apparatus according to the present invention, the velocity of the relative movement of the jet head and the substrate may be no more than ⅓ of the velocity of the ejected droplet.

In the solution jet type fabrication apparatus according to the present invention, the jet head may eject the droplet using the growth displacement force of a thermally generated bubble so that the droplet has an elongated shape along the ejecting direction with a trailing droplet, and so that the length of the elongated droplet in the ejecting direction is no less than five times the length of the elongated droplet in a direction perpendicular to the ejecting direction.

In the solution jet type fabrication apparatus according to the present invention, the jet head may include a filter situated at an upstream location of the nozzle.

In the solution jet type fabrication apparatus according to the present invention, the filter may be situated at a position nearest to the nozzle.

In the solution jet type fabrication apparatus according to the present invention, the filter may trap a foreign particle with a size equal to or greater than 30 times the diameter of the fine particle.

Furthermore, the present invention provides a solution used for a solution jet type fabrication apparatus for fabricating a wiring pattern or a device, the solution jet type fabrication apparatus having a jet head for ejecting a droplet onto a substrate, so as to form a pattern, by vaporizing a volatile ingredient of the solution, and allowing a solid component to remain on the substrate, the substrate having no liquid absorbing property, the jet head including a nozzle from which the droplet is ejected, the nozzle having a size that is equal to or less than $\Phi 20$ μm, the solution including: fine particles where each of the fine particles has a size that is equal to or less than the roughness of a surface of the substrate, the fine particles satisfying a relation of $0.0001 \leq Dp/Do \leq 0.01$, where Dp represents the diameter of each of the fine particles and Do represents the diameter of the nozzle, and the fine particles having a hardness less than that of a material of the nozzle.

Furthermore, the present invention provides a substrate used for a solution jet type fabrication apparatus for fabricating a wiring pattern or a device, the solution jet type fabrication apparatus having a jet head for ejecting a droplet of a solution containing fine particles onto a substrate, so as to form a pattern, by vaporizing a volatile ingredient of the solution, and allowing a solid component to remain on the substrate, the jet head including a nozzle from which the droplet is ejected, the nozzle being formed from a material that has a greater hardness than that of the fine particles in the solution, the nozzle having a size that is equal to or less than $\Phi 20$ μm, the nozzle satisfying a relation of $0.0001 \leq Dp/Do \leq 0.01$, where Dp represents the diameter of each of the fine particles and Do represents the diameter of the nozzle, the substrate including: an electrode area on which the wiring pattern is formed, wherein the substrate has no liquid absorbing property, wherein the substrate has a surface having a roughness that is equal to or greater than the size of each of the fine particles.

In the substrate according to the present invention, the electrode area may be formed as a rectangular pattern, wherein a corner of the rectangular pattern may be chamfered.

In the substrate according to the present invention, the electrode area may be formed as a combination of rectangular patterns, wherein a corner of each of the rectangular patterns may be chamfered.

In the substrate according to the present invention, the electrode area may be formed as a rectangular pattern, wherein a corner of the rectangular pattern may be covered with one or more round-shaped dots.

In the substrate according to the present invention, the electrode area may be formed as a combination of rectangular patterns, wherein a corner of each of the rectangular patterns may be covered with one or more round-shaped dots.

In the substrate according to the present invention, the electrode area may be formed as a pattern of one or more round-shaped dots by ejecting a droplet of a solution containing fine particles onto the substrate, so as to form the pattern, by vaporizing a volatile ingredient of the solution, and allowing a solid component to remain on the substrate.

In the substrate according to the present invention, the wiring pattern may be a strip-like pattern extending in parallel to two perpendicular directions, the strip-like pattern being formed of a combination of round-shaped dots.

In the substrate according to the present invention, the strip-like pattern may have a portion that is bent in a right angle, wherein an outer area of the bent portion may be formed as a curve.

Furthermore, the present invention provides a substrate used for a solution jet type fabrication apparatus for fabricating a wiring pattern or a device, the solution jet type fabrication apparatus having a jet head for ejecting a droplet of a solution containing fine particles onto a substrate, so as to form a pattern, by vaporizing a volatile ingredient of the solution, and allowing a solid component to remain on the substrate, the jet head including a nozzle from which the droplet is ejected, the nozzle being formed from a material that has a greater hardness than that of the fine particles in the solution, the nozzle having a size that is equal to or less than Φ20 μm, the nozzle satisfying a relation of $0.00011 \leq Dp/Do \leq 0.01$, where Dp represents the diameter of each of the fine particles and Do represents the diameter of the nozzle, the substrate including: an electrode area on which the device is formed, wherein the substrate has no liquid absorbing property, wherein the substrate has a surface having a roughness that is equal to or greater than the size of each of the fine particles.

In another substrate according to the present invention, the electrode area may be formed as a rectangular pattern, wherein a corner of the rectangular pattern may be chamfered.

In another substrate according to the present invention, the electrode area may be formed as a combination of rectangular patterns, wherein a corner of each of the rectangular patterns may be chamfered.

In another substrate according to the present invention, the electrode area may be formed as a rectangular pattern, wherein a corner of the rectangular pattern may be covered with one or more round-shaped dots.

In another substrate according to the present invention, the electrode area may be formed as a combination of rectangular patterns, wherein a corner of each of the rectangular patterns may be covered with one or more round-shaped dots.

In another substrate according to the present invention, the electrode area may be formed as a pattern of one or more round-shaped dots by ejecting a droplet of a solution containing fine particles onto the substrate, so as to form the pattern, by vaporizing a volatile ingredient of the solution, and allowing a solid component to remain on the substrate.

In another substrate according to the present invention, the device may be a strip-like pattern extending in parallel to two perpendicular directions, the strip-like pattern being formed of a combination of round-shaped dots.

In another substrate according to the present invention, the strip-like pattern may have a portion that is bent in a right angle, wherein an outer area of the bent portion may be formed as a curve.

Furthermore, the present invention provides a method for fabricating a wiring pattern or a device, the method including the steps of: ejecting a droplet of a solution containing fine particles onto a substrate, by using a jet head; vaporizing a volatile ingredient of the solution; and allowing a solid component to remain on the substrate, wherein the substrate has no liquid absorbing property, wherein the jet head includes a nozzle from which the droplet is ejected, the nozzle being formed from a material that has a greater hardness than that of the fine particles in the solution, wherein the nozzle has a size that is equal to or less than Φ20 μm, the nozzle satisfying a relation of $0.0001 \leq Dp/Do \leq 0.01$, where Dp represents the diameter of each of the fine particles and Do represents the diameter of the nozzle, wherein each of the fine particles has a size that is equal to or less than the roughness of a surface of the substrate.

It is another and more specific object of the present invention to provide a solution jet type fabrication apparatus for fabricating a wiring pattern substrate or a device substrate with high quality and high precision.

It is another and more specific object of the present invention to provide conditions for fabricating a wiring pattern substrate or a device substrate with high quality and high precision by using the solution jet type fabrication apparatus.

It is another and more specific object of the present invention to provide conditions for fabricating a wiring pattern substrate or a device substrate with high quality and high precision by using another solution jet type fabrication apparatus.

It is another and more specific object of the present invention to provide conditions for fabricating a wiring pattern substrate or a device substrate with high quality and high precision by using a further solution jet type fabrication apparatus.

It is another and more specific object of the present invention to provide a means to attain reliability of the foregoing solution jet type fabrication apparatuses.

It is another and more specific object of the present invention to provide a solution containing fine particles used for the foregoing apparatuses and for maintaining reliability of the foregoing apparatuses.

It is another and more specific object of the present invention to provide a high precision and high quality wiring pattern substrate fabricated by the foregoing apparatuses.

It is another and more specific object of the present invention to provide device substrate that is fabricated by the foregoing apparatuses and is provided with a high precision and high quality function.

It is another and more specific object of the present invention to provide a high precision, high quality, and highly reliable wiring pattern substrate fabricated by the foregoing apparatuses.

It is another and more specific object of the present invention to provide another high precision, high quality, and highly reliable wiring pattern substrate fabricated by the foregoing apparatuses.

It is another and more specific object of the present invention to provide a further high precision, high quality, and highly reliable wiring pattern substrate fabricated by the foregoing apparatuses.

It is another and more specific object of the present invention to provide device substrate that is fabricated by the foregoing apparatuses and is provided with a high precision, high quality, and highly reliable function.

It is another and more specific object of the present invention to provide another device substrate that is fabricated by the foregoing apparatuses and is provided with a high precision, high quality, and highly reliable function.

It is another and more specific object of the present invention to provide a further device substrate that is fabricated by the foregoing apparatuses and is provided with a high precision and high quality function.

It is another and more specific object of the present invention to provide another high precision and high quality wiring pattern substrate fabricated by the foregoing apparatuses.

It is another and more specific object of the present invention to provide another device substrate that is fabricated by the foregoing apparatuses and is provided with a high precision and high quality function.

Other objects and further features of the present invention will be apparent from the following detailed description when read in conjunction with the accompanying drawings.

BRIEF DESCRIPTION OF THE DRAWINGS

FIGS. 4A and 4B are schematic drawings respectively showing a solution jet type fabrication apparatus applied for fabricating a wiring pattern substrate or a device substrate according to the present invention;

FIGS. 5A and 4B are drawings for explaining a liquid jet principle (liquid jet technique) that employs a jet head utilizing piezo elements for suitable use by the present invention;

DESCRIPTION OF THE PREFERRED EMBODIMENTS

In the following, embodiments of the present invention will be described with reference to the accompanying drawings.

Figure 1A:
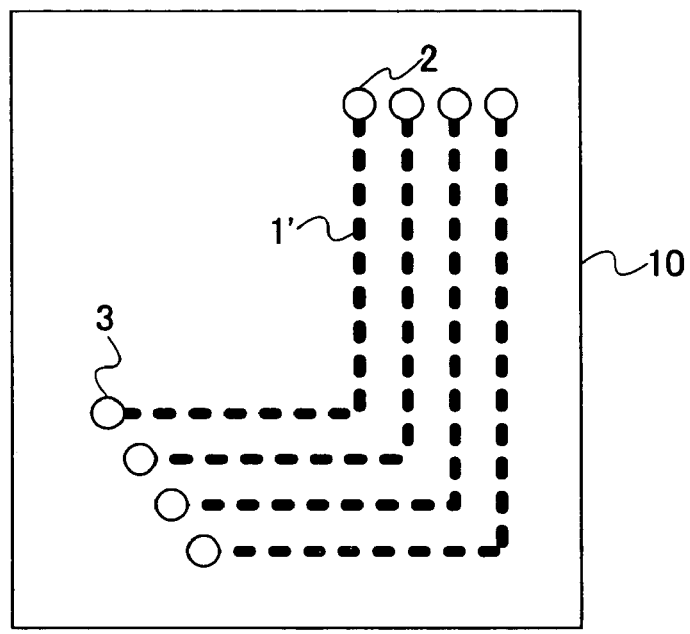
FIGS. 1A and 1B are drawings for explaining an embodiment of a wiring pattern formed with a solution jet type fabrication apparatus according to the present invention.
Figure 1B:
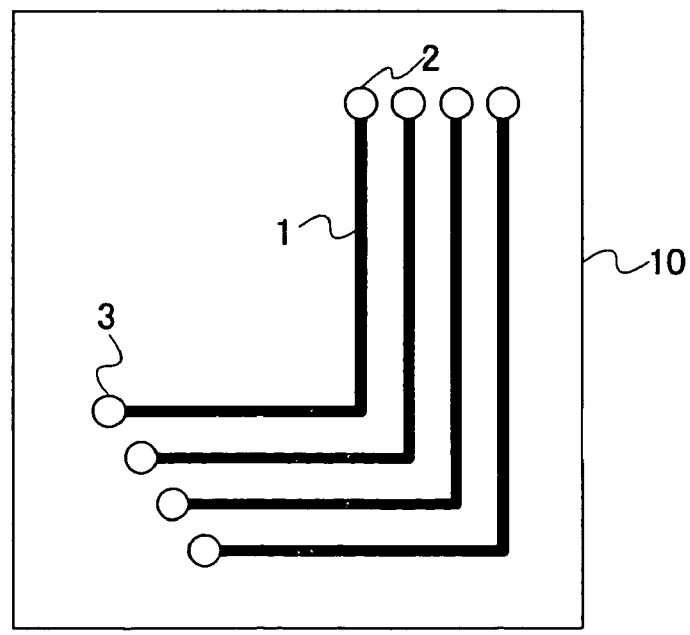

FIGS. 1A and 1B are drawing for explaining an example for forming a pattern on a glass substrate, a plastic substrate, a semiconductor substrate (e.g. Si substrate), a glass epoxy substrate, or a flexible substrate by using a method (technique) according to an embodiment of the present invention. FIG. 1A shows a state where terminals 2, 3 are formed on a substrate 10, in which a dotted portion 1' indicates an area at which a wiring pattern is to be formed. FIG. 1B shows an example of forming a wiring pattern by ejecting and drawing a solution that includes conductive fine particles with use of a liquid jetting technique.

According to an embodiment of the present invention, an inkjet technique is used as a method for applying a solution containing conductive fine particles. A detail description of such method is given below.

Figure 2:
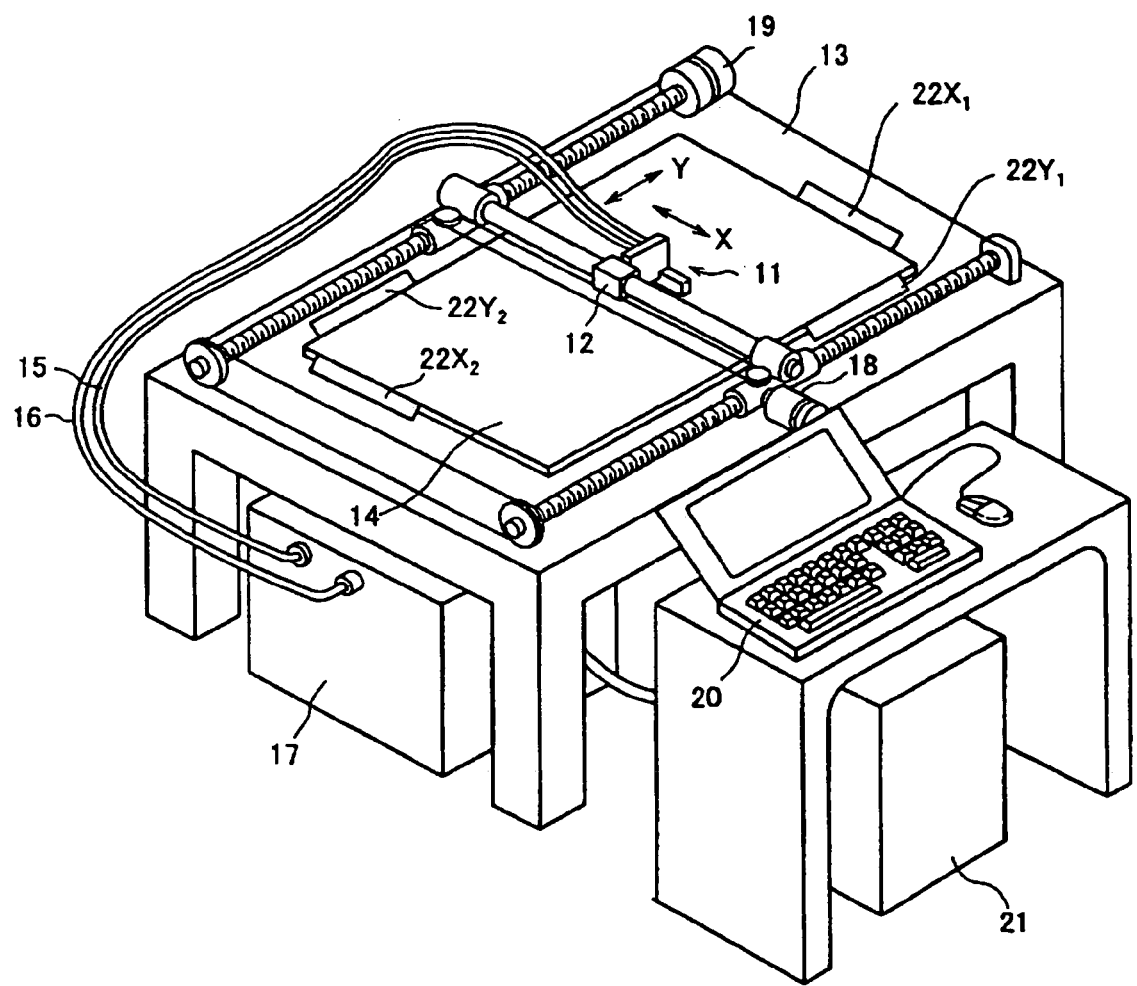
FIG. 2 is a drawing for explaining an embodiment of a solution jet type fabrication apparatus for fabricating a wiring pattern substrate or a device substrate according to the present invention.

FIG. 2 is a diagram for explaining a fabrication apparatus for forming a wiring pattern or a functional device according to an embodiment of the present invention. In this diagram, reference numeral 11 denotes a jet head unit (jet head); 12 denotes a carriage; 13 denotes a substrate support bench (or a substrate holder); 14 denotes a substrate, for example, a wiring substrate on which a wiring pattern is to be formed, or a device substrate on which a device with a function (functional device) is to be formed; 15 denotes a supply tube for the solution that includes conductive fine particles; 16 denotes a signal supply cable; 17 denotes a jet head control box (including a solution tank); 18 denotes an X-direction scanning motor for the carriage 12; 19 denotes a Y-direction scanning motor for the carriage 12; 20 denotes a computer; 21 denotes a control box; and 22 (22X$_1$, 22Y$_1$, 22X$_2$, 22Y$_2$) denotes substrate positioning/holding unit. In this example, the jet head 11 is moved by scanning of the carriage 12 and jets the solution containing conductive fine particles to the substrate 14 disposed on the substrate support bench 13.

Figure 3:
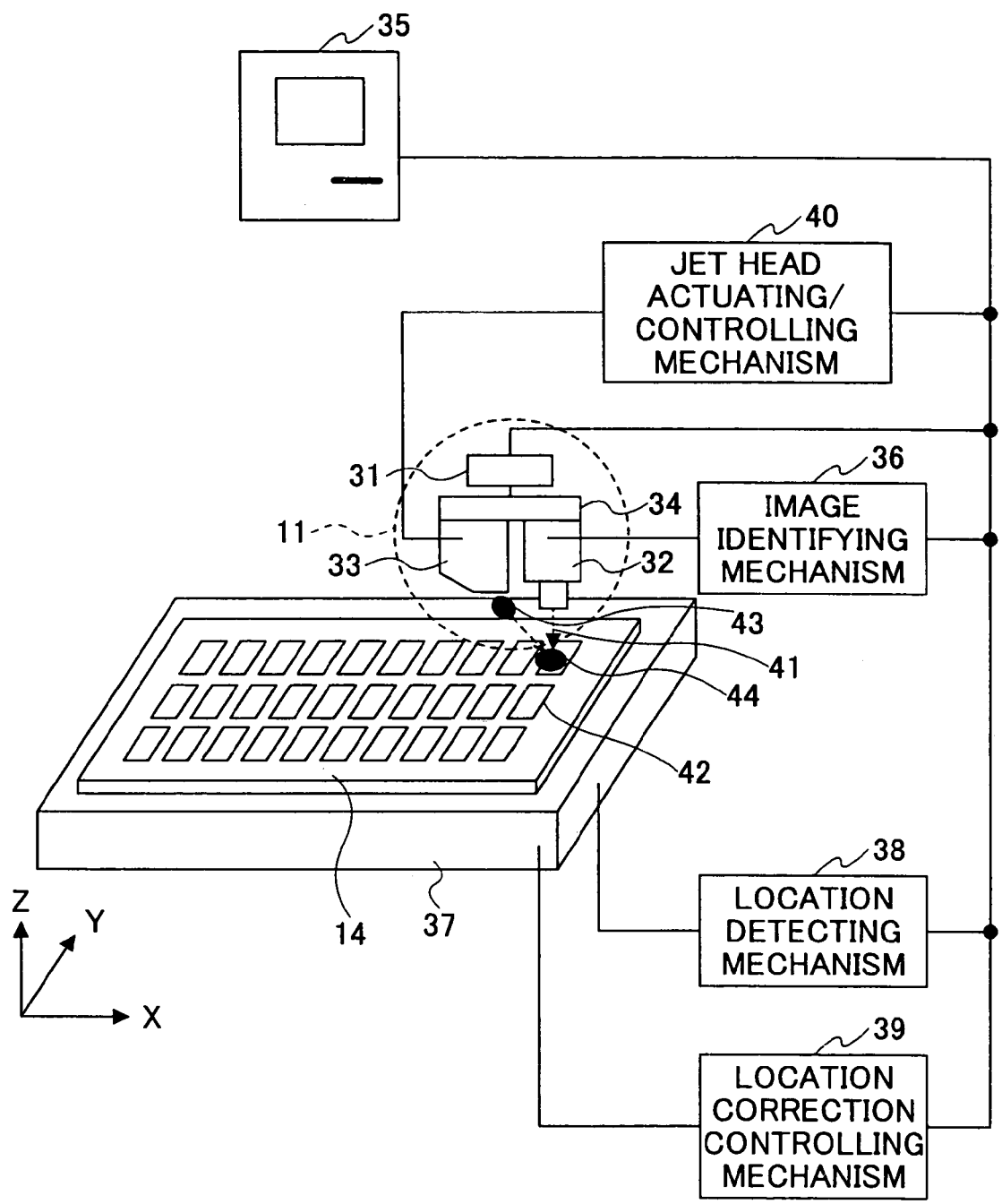
FIG. 3 is a drawing for explaining another embodiment of a solution jet type fabrication apparatus for fabricating a wiring pattern substrate or a device substrate according to the present invention.
Figure 31:
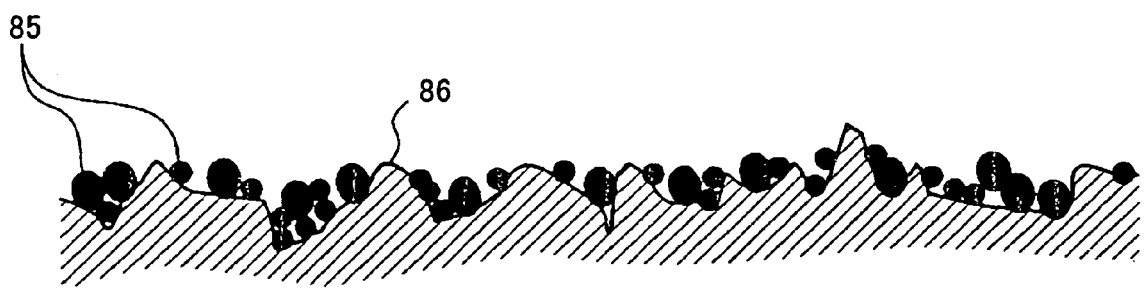
FIG. 31 is a schematic view showing a relation between fine particles and surface roughness in a case where dot patterns are formed by a solution containing fine particles that are no more than the surface roughness of a substrate.

FIG. 3 is a schematic diagram illustrating the configuration of a solution jet type fabrication apparatus (droplet applicator) used to fabricate a wiring pattern substrate or to form a functional device of the present invention; and FIG. 4 is a schematic diagram of the principle parts of the droplet applicator jet head unit in FIG. 3. The configuration in FIG. 3 differs from that in FIG. 2, where a wiring pattern or a functional device is formed on the substrate by making the substrate 14 side move. In FIG. 3 and FIG. 4, 31 is a head alignment control mechanism, 32 is a detection optical system, 33 is an jet head, 34 is a fine head alignment mechanism, 35 is a control computer, 36 is an image identification mechanism, 37 is an XY direction scan mechanism, 38 is a position detection mechanism, 39 is a positional correction control mechanism, 40 is an jet head drive/control mechanism, 41 is an optical axis, 42 are device electrodes, 43 is a droplet, and 44 is a location for droplet impact.

Any appropriate mechanism may be used as the droplet applicator (jet head 33) in the jet head unit 11 as long as it can eject fixed quantities of arbitrary droplets, however, a mechanism based on an inkjet technique (ink jet principle) that is capable of forming droplets ranging from 0.1 pl to several hundreds pl is especially preferable.

There are many inkjet techniques. For example, an electrical signal is applied to a piezoelectric vibrator so as to convert the electrical signal into mechanical vibration of a piezoelectric vibrator, which causes a droplet to be ejected from a minute nozzle. This method is disclosed in U.S. Pat. No. 3,683,212 (Zoltan method), U.S. Pat. No. 3,747,120 (Stemme method), and U.S. Pat. No. 3946398 (Kyser method). This is generally known as a drop-on-demand method.

Another method (the Sweet method) is disclosed in, for example, U.S. Pat. Nos. 3,596,275 and 3,298,030. In this method, a droplet of a recording fluid containing a controlled amount of electrostatic charge is produced using a continuous vibration generating technique. The produced droplet of the recording fluid flies between polarizing electrodes under the application of a uniform electric field, so as to reproduce images on a recording member. This is generally called the continuous flow method, or charge control method.

Yet another method is disclosed in Japanese Patent Publication after Examination (Koukoku) No. 56-9429. In this method, air bubbles are generated in the fluid, and the bubbles act on the fluid so as to cause a droplet to be ejected from a minute nozzle. This technique is generally called the thermal inkjet method or bubble inkjet method.

Among these methods, including the drop-on-demand, the continuous flow method, and the thermal inkjet method, any appropriate method can be chosen in accordance with needs.

According to the present invention, an apparatus for fabricating a wiring pattern substrate or for forming a functional device (FIG. 2) is used. The holding position of the substrate 14 is fixed by the substrate positioning/holding unit 22 for adjusting and determining the substrate holding position. As shown simplified in FIG. 2, the substrate positioning/holding unit 22 makes contact with each side of the substrate 14, and is capable of making fine adjustments on the submicron order in the X-direction and the Y-direction. The substrate positioning/holding unit 22 is connected to a jet head control box 17, computer 20, and control box 21, thereby allowing for constant feedback of the substrate positioning information, as well as fine adjustment displacement information, droplet positioning information, and ejection timing.

Moreover, in addition to the X/Y direction position adjustment mechanism, the fabrication apparatus for the wiring pattern substrate or functional device has a rotational position adjustment mechanism although it is not shown in the drawings (because it is positioned beneath the substrate 14). In connection with this, the shape of the wiring pattern substrate or functional device and array of the functional devices (group of functional devices) will be described first.

A glass substrate, a ceramics substrate, various plastic substrates as PET, a semiconductor substrate such as a Si substrate, a glass epoxy substrate, a flexible film comprising high polymer film such as polyimide film, polyamide film, or polyester film may be used as the wiring pattern substrate or device substrate (functional device mounting substrate) of the present invention. The aforementioned various types of plastic substrates including PET or the high polymer films may, for example, be suitably used for the purpose of reducing the weight and increasing flexibility.

However, it is to be noted that, although the present invention uses an inkjet technique for applying a solution containing fine particles, the aforementioned substrates do not have a liquid absorbing property (in contrast to a medium such as paper which absorbs, for example, a solvent of ink). This is a point of the solution jet type fabrication apparatus using an inkjet technique according to an embodiment of the present invention which is different from an inkjet recording apparatus.

In any case, the shape of the various plastic substrates or the high polymer films used for the wiring pattern substrate or the functional device according to the present invention is rectangular, in view of economical production and supply, and of practical use of the final product (that is, functional device mounting board). Accordingly, the substrate has two vertical sides parallel to each other and two horizontal sides parallel to each other, which configure a rectangular shape. A vertical side and a horizontal side make a right angle.

A group of functional devices are arranged in a matrix on the rectangular substrate so that the two mutually orthogonal directions of this matrix are parallel to the directions of the vertical sides and the horizontal sides of this substrate, respectively. The reasons for this arrangement (i.e., arraying the functional devices in a matrix and making the vertical and horizontal sides of the substrate parallel with the two orthogonal directions of that matrix) will be explained below.

As illustrated in FIG. 2 or FIG. 3, once the position of the solution ejecting surface of the jet head unit 11 with respect to the substrate 14 is determined, no particular positional control is required. The jet head unit 11 ejects the solution, while moving in the X and Y directions relative to the substrate so as to keep parallel to the functional device forming surface with a fixed distance from the substrate 14. Basically, the X-direction and Y-direction are two mutually orthogonal directions. By setting the vertical side or the horizontal side of the substrate parallel to the Y-direction or X-direction during the positioning, a group of functional devices can be formed precisely using a mechanism of ejecting the solution and a mechanism of causing relative displacement, because the two directions of the matrix array of the functional device are also parallel to the sides of the substrate. In other words, using a rectangular substrate and the relative displacement mechanism in the X and Y directions, and setting the array of the functional devices so that the sides of the array are parallel to the sides of the substrate, allow a matrix of functional devices to be formed at high precision by accurately positioning the substrate prior to ejecting droplets onto the substrate.

The rotational position adjustment mechanism mentioned earlier is now described. As previously mentioned, the present invention aims to provide a highly-precise functional device matrix array by accurately positioning the substrate before the ejection of droplets onto the substrate, and by causing relative displacement in the X and Y directions without executing additional control operations. When carrying out initial positioning of the substrate, there may be an offset (or positional shift) existing in the rotational direction about the Z-axis perpendicular to the plane defined by the X and Y directions.

In order to compensate for this rotational offset, a rotational position adjustment mechanism (not shown in the drawings since it is positioned beneath the substrate 14) is provided to the fabrication apparatus. By compensating the rotational deviation and by correctly positioning the substrate, a highly precise matrix array of functional devices can be obtained simply by the relative displacement in the X and Y directions.

In the above-described example, the rotational position adjustment mechanism has been described as a separate mechanism from the substrate positioning/holding unit 22 ($22X_1$, $22Y_1$, $22X_2$, $22Y_2$) of FIG. 2 (not visible since positioned beneath the substrate 14). However, the substrate positioning/holding unit 22 may include the rotational position adjustment mechanism. For example, the substrate positioning/holding unit 22 makes contact with the sides of the substrate 14, and the whole substrate positioning/holding unit 22 is made capable of adjusting the position in the X-direction and Y-direction. In this case, angle adjustment can be conducted by providing two screws positioned apart from each other and movable independently of each other to each of the substrate positioning/holding unit 22 that receive one of the sides of the substrate 14. The rotational position control information is supplied to the jet head control box 17, computer 20, and control box 21, together with the X, Y direction positioning information and fine adjustment displacement information. This arrangement allows for constant feedback of droplet positioning information and ejection timing information to the substrate positioning mechanism.

Although the substrate according to a preferred embodiment of the present invention is basically shaped as a rectangle, the substrate is not to be restricted to the rectangular shape. In a case of forming semiconductor substrates as Si substrates which are provided as round shaped wafers, an orientation flat indicating the direction of the crystal axis may be joined to the substrate positioning/holding unit 22.

Next, another configuration of the positioning unit will be described. The substrate positioning/holding unit 22 of the above description makes contact with the sides of the substrate 14, and the entirety of the substrate positioning/holding unit 22 is capable of adjusting the position of the substrate in the X-direction and Y-direction. Instead of making use of the sides of the substrate, strip-shaped patterns extending in two perpendicular directions may be formed on the substrate 14. As previously mentioned, the functional device array is formed as a matrix. Accordingly, the strip-shaped patterns extending in two perpendicular directions are set parallel to the two mutually orthogonal sides of the matrix. Such patterns can be easily formed on the substrate using a photofabrication technique.

Other than applying the present invention for forming the functional device array (group of functional devices) as a matrix, the present invention may also be applied to a case of forming a wiring pattern as shown in FIGS. 1A and 1B. In this case, the wiring pattern are formed extending in two perpendicular directions and are set parallel to the two the vertical and horizontal direction (X-direction, Y-direction) of a substrate. Instead of forming the strip-shaped patterns separately only for the purpose of positioning, device electrodes 42 (FIGS. 4A, 4B) or the wiring patterns extending in the X-direction and Y direction may, for example, be used as the positioning strip patterns extending in two perpendicular directions. Such strip-shaped patterns can be detected by a detection optical system 32 using a CCD camera and lens, which will be described with reference to FIG. 4 below, and the detected information can be fed back to the positional adjustment.

Concerning the Z direction perpendicular to the X-Y plane, the positional control is not particularly necessary in the Z direction once the positional relationship between the solution ejecting face of the jet head unit 11 and the substrate 14 is initially determined. Namely, the jet head unit 11 ejects the solution containing a functional material, while it moves relative to the substrate 14 in the X and Y directions maintaining a fixed distance (e.g. 1 to 3 mm) from the substrate 14. Positional control of the jet head unit 11 in the Z direction is not performed during the ejection to prevent the associated mechanisms and the control system from becoming complex. In addition, if positional adjustment is carried out in the Z direction during the ejection, it takes a longer time to form the functional device on the substrate through application of droplets, resulting in reduced productivity.

Instead of performing positional control in the Z direction during the ejection, the levelness of the substrate 14 and the substrate support means is improved, as well as improving the precision of a carriage mechanism that drives the jet head unit 11 relative to the substrate 14 in the X, Y directions. The productivity is enhanced by increasing the rate of the relative displacement between the jet head unit 11 and substrate 14 in the X, Y directions, even without performing positional control in the Z direction during ejection. To give an example, fluctuation in distance between the substrate 14 and the solution ejecting surface of the jet head unit 11 during the ejection of the droplets is kept no more than 2 mm (in the case where the size of the substrate 14 is no less than 100 mm×100 mm and no more than 4000 mm×4000 mm).

A plane defined by the X and Y directions is generally held horizontal. However, if the substrate 14 is small (for example, when no more than 500 mm×500 mm), the X-Y plane is not necessarily held horizontal, but should be set so that the positional relationship makes the substrate 14 be located most efficiently for that device.

FIGS. 4A and 4B illustrates the configuration of the jet head unit 11. In FIGS. 4A, 4B reference numeral 32 denotes the detection optical system that takes in the image information of the top face of the substrate 14. The detection optical system 32 is adjacent to the jet head 33 that ejects the droplet 43, and is arranged so that the optical axis 41 and focal point of the detection optical system 32 coincides with the location of impact 44 of the droplet 43 through the jet head 33.

In this case, the positional relationship between the detection optical system 32 and jet head 33 illustrated in FIG. 3 can be precisely adjusted via the fine head alignment mechanism 34 and head alignment control mechanism 31. Furthermore, a CCD camera and lens are used for the detection optical system 32.

In FIG. 3, the reference numeral 36 denotes the image identification mechanism, which identifies the image information detected by the detection optical system 32. The image identification mechanism 36 converts image contrast into binary data, and calculates the center of balance of a specific portion of the binary contrast. Specifically, the high-resolution image recognition device VX-4210 manufactured by Keyence Corporation may be used. A position detection mechanism 14 provides the position information existing on the substrate 14 to the image information obtained by the image identification mechanism. Length measuring equipment, such as a linear encoder, furnished in the XY direction scan mechanism 37 may be utilized here. The positional correction control mechanism 39 performs positional correction based upon the positional information on the functional device mounting board 14 and image information, whereby movement of the XY direction scan mechanism 37 is corrected. The jet head 33 is driven by the jet head control/drive mechanism 40, whereby the droplet is applied onto the functional device mounting board 14. Each of the control mechanisms mentioned thus far are centrally controlled by the control computer 35.

Although the droplet shown in FIG. 4B is illustrated in a manner jetted diagonally upon a substrate surface, this illustration is provided for the convenience of showing the detection optical system 32 together with the jet head 33. In actual use, the droplet is jetted substantially perpendicular with respect to the substrate.

In this example, the jet head unit 11 is fixed, while relative displacement between the jet head unit 11 and functional device mounting board 14 is implemented through the motion of the functional device mounting board 14 to an arbitrary position by means of the XY direction scan mechanism. Needless to say, however, as illustrated in FIG. 2, the functional device mounting board 14 may be fixed, while driving the jet head unit 11 in the X and Y directions. Particularly in cases of applying in manufacture of midsize substrates 200 mm×200 mm to large size substrates of 2000 mm×2000 mm or larger, the latter structure is preferable, where the functional device mounting board 14 is fixed, while driving the jet head unit 11 scans in the two orthogonal X and Y directions. In this case, droplets of the solution are also ejected along the X direction and Y direction.

In cases where substrate size is 200 mm×200 mm or smaller, the jet head unit for ejecting droplet is designed as a large-array multi-nozzle jet head unit capable of covering a range of 200 mm, so as to allow the relative displacement between the jet head unit and the substrate in only one direction (for example, only the X direction), instead of moving in two orthogonal directions (X and Y directions). This arrangement can achieve high mass productivity. If the substrate size exceeds 200 mm×200 mm, it is difficult to manufacture such a large-array multi-nozzle jet head unit capable of covering the range beyond 200 mm from the standpoint of the cost and the technical aspect. In this case., the jet head unit 11 is designed so as to scan in the two orthogonal X and Y directions to eject droplets of the solution in X and Y directions alternately.

Particularly, when manufacturing a substrate smaller than 200 mm×200 mm by cutting a large substrate of 400 mm×400 mm through 2000 mm×2000 mm or larger, the array of the functional devices is formed on such a large substrate using the inkjet technique. Accordingly, it is preferable for the jet head unit 11 to scan in the two orthogonal X and Y directions alternately to eject solution droplets onto predetermined positions on the substrate.

A solution containing minute conductive fine particles is used as the material of the droplets 43. As examples that are preferably used, there are solutions including metal fine particles such as Au, Pt, Ag, Cu, Ni, Cr, Rh, Pd, Zn, Co, Mo, Ru, W, Os, Ir, Fe, Mn, Ge, Sn, Ga, and/or In.

Particularly, a fine circuit pattern, which has low electric resistance and is strong against corrosion, can be obtained by employing metal fine particles such as Au, Ag, and Cu.

As the solution containing conductive fine particles according to an embodiment of the present invention, there are an aqueous solution and an oil solution.

An aqueous solution, which is a dispersant mainly composed of water having minute conductive fine particles dispersed therein, is, for example, prepared with a method described below.

In this method, a water soluble polymer is dissolved in a metal ion aqueous solution (e.g. gold chloride, silver nitrate) and added with alkanolamine such as dimethylaminoethanol while being agitated. The solution is subjected to reduction of metal ions for several tens of seconds to several minutes, and subjected to eduction of metal fine particles with an average diameter no more than 0.5 μm (500 nm). Then, chlorine ions or nitrate ions, for example, are removed by an ultrafiltration membrane, and then subjected to concentration/drying, to thereby obtain a solution containing concentrated conductive fine particles. The solution containing concentrated conductive fine particles may be stably dissolved/mixed with water, alcoholic solution, or a binder used for a sol-gel process (e.g. tetraethoxysilane, triethoxysilane).

An oil solution, which is a dispersant mainly composed of oil having minute conductive fine particles dispersed therein, is, for example, prepared with a method described below.

In this method, an oil soluble polymer is dissolved in a water miscible organic solvent (e.g. acetone) and mixed with metal ion aqueous solution. Although this mixture is a heterogeneous system, metal fine particles are extracted toward an oil phase in a manner dispersed in the polymer when alkanolamine is added while agitating the mixture. By concentrating/drying the mixture, a solution containing concentrated conductive fine particles can be obtained. The solution containing concentrated conductive fine particles can be stably dissolved/mixed with, for example, a solvent of an aromatic system, a ketone system, or an ester system, or a resin of polyester, epoxy, acryl, or polyurethane.

Although the density of the conductive fine particles in the solution containing conductive fine particles may be a maximum of 80% by weight, the solution containing conductive fine particles is suitably diluted according to the purpose for use. In the solution containing conductive fine particles, the conductive fine particles included therein is, usually, 2 to 50% by weight, the surface active agent and resin included therein is 0.3 to 30% by weight, and the viscosity thereof is 3 to 30 centipoise.

With any one of the above-mentioned materials, the present invention performs formation of wiring patterns and functional devices by vaporizing (evaporating) the volatile component in the solution so as to leave the solid content remaining on the substrate. This solid component exhibits the functions of the associated devices. The solvent (volatile component) is a vehicle for allowing the solution to be ejected using the inkjet technique.

As the material of the droplet 43, there are, for example, a I-VII group compound semiconductor such as CuCl, a II-VI group compound semiconductor such as CdS, CdSe, a III-V group compound such as InAs, or a semiconductor crystal as a IV group semiconductor, a metal oxide such as $TiO_2$, SiO, $SiO_2$, a inorganic compound such as a fluorescent material, fullerene, dendrimer, an organic compound such as phthalocyanine, azo compound, or solution that include nanoparticles of, for example, composite materials of the aforementioned materials.

The nanoparticles according to an embodiment of the present invention typically have a particle diameter of 0.0005 through 0.2 μm (0.5 through 200 nm) and more preferably a particle diameter 0.0005 through 0.05 μm (0.5 through 50 nm). More particularly, the particle diameter is determined by taking into consideration, for example, the stability of dispersion of fine particles when manufacturing the solution, the possibility of clogging during ejection (jetting), or the surface roughness of the pattern targeted substrate.

It is to be noted that, as long as the objective of the present invention can be attained, the surface of the nanoparticles may be subjected to chemical or physical processing, or an additive such as a surface active agent, a dispersion stabilizing agent, or an antioxidant may also be added. The nanoparticles may be synthesized with, for example, a colloid chemistry method such as a reversed micelle method (Lianos, P. et al., Chem. Phys. Lett., 125, 299 (1986)) or a hot THORP (Thermal Oxide Reprocessing Plant) method (Peng, X. et al., J. Am. Chem. Soc., 119, 7019 (1997)).

The solution containing nanoparticles that is preferably used in an embodiment according to the present invention is a dispersion liquid in which the nanoparticles are dispersed in an emulsion (O/W emulsion) where a continuous phase thereof is an aqueous phase and a dispersed phase thereof is an oil phase.

Although the aqueous phase is mainly water, a water soluble organic solvent may be added to the water. As for the water soluble organic solvent, there are, for example, ethyleneglycol, propylene glycol, butylene glycol, diethylene glycol, triethylene glycol, polyethylene glycol (#200, #400), glycerin, alkylether class of the aforementioned glycol classes, N-methylpyrrolidone, 1,3 dimethylimidazolinone, thiodiglycol, 2-pyrrolidone, sulfolane, dimethylsulfoxide, diethanolamine, triethanolamine, ethanol, and isopropanol. The amount of the water soluble organic solvent used in the aqueous dispersion medium is preferably no more than 30% by weight, and more preferably 20% by weight.

Although the range of the amount of nanoparticles included in the dispersion liquid differs depending on the structure, the alignment of particles, and/or the thickness of the desired film (layer), it is preferably 0.01 through 15% by weight, and more preferably 0.05 through 10% by weight. If the amount of nanoparticle is too small, the function of the device cannot by suitably attained, and if the amount is too large, jetting stability cannot be obtained when jetting droplets according to the inkjet technique.

Furthermore, it is preferable to allow a surface active agent and a solvent for dispersing nanoparticles to coexist in the dispersion liquid of the solution containing nanoparticles according to an embodiment of the present invention. As for the surface active agent, there are, for example, an anion system surface active agent (dodecylbenzene sulfonic acid natrium, lauric acid natrium, polyoxyethelenealkylethersulfate, ammonium salt and the like), and nonanion system surface active agent (polyoxyethylenealkylether, polyoxyethylenealkylester, polyoxyethylenesoribitanfattyacidester, polyoxyethylenealkylamide and the like), in which the agents may be used independently or as a mixture of two or more kinds.

The range of the amount of the surface active agent in the entire solution is typically 0.1 through 30% by weight, and more preferably 5 through 20% by weight. If the amount of the surface active agent is too small compared to the foregoing range, a water-oil separation in the aqueous dispersing liquid may be created and may prevent a pattern from being evenly coated by droplet ejection. On the other hand, if the amount of the surface active agent is too large compared to the foregoing range, the viscosity in the aqueous dispersing liquid may become too high.

As for the solvent for dispersing nanoparticles, there are, for example, volatile liquids of toluene, hexane, pyridine, chloroform. The range of the amount of the solvent for dispersing nanoparticles is approximately 0.1 through 20% by weight, and more preferably 1 through 10% by weight. If the amount of the solvent for dispersing nanoparticles is too small compared to the foregoing range, the amount of ultra fine particles that can be included in the aqueous dispersing liquid would become small. On the other hand, if the amount of solvent for dispersing nanoparticles is too large compared to the foregoing range, there is a risk of creating a water-oil separation in the aqueous dispersing liquid.

Furthermore, an organic compound may be dissolved in the dispersing liquid. As for the organic compound, there are, for example, trioctylphosphinoxide (TOPO), thiophenol, photochromic compound (spiropyrane, fulgide), a charge transfer type complex, and an electron accepting compound, in which the organic compound is preferably solid in ordinary temperature. In this case, the amount of organic compound in the dispersing liquid with respect to the nanoparticles is 1/10000 or more by weight, and more preferably approximately 1/10000 through 10 times by weight.

It is to be noted that, as long as the objective of the present invention can be attained, an additive such as a surface active agent, a dispersion stabilizing agent, or an antioxidant, a polymer, or a material that gelates in a coating/drying process may be added to the suspension.

The above-described solution containing nanoparticles is jetted onto a substrate with an inkjet technique and dried to thereby form a wiring pattern or a functional device. In an embodiment according to the present invention, the drying is conducted, for example, by air-drying in atmospheric pressure under a temperature of −20 through 200° C. (more preferably, approximately 0 through 100° C.) for 1 hour or more (more preferably, 3 hours or more), and then drying under reduced pressure may be conducted according to necessity. Although the drying under reduced pressure may be $1 \times 10^5$ Pa or less, it is preferably to be approximately $1 \times 10^4$ Pa or less. Further, in the drying under reduced pressure, the temperature is typically −20 through 200° C., and more preferably approximately 0 through 100° C. Further, the time for drying under reduced pressure is approximately 1 through 24 hours.

Although the thickness of the thin nanoparticle film obtained by the aforementioned method is not restricted in particular, it usually ranges from the diameter of a nanoparticle through 1 mm, and more preferably approximately the diameter of a nanoparticle through 100 μm. Further, it is preferable for the nanoparticles in the thin nanoparticle film to be disposed in a manner exceeding a certain density.

Accordingly, the average space (distance) among the respective nanoparticles in the nanoparticle aggregate is typically no more than 10 times the particle diameter, and more preferably no more than 2 times the particle diameter. If the average space among the respective particles is too large, the nanoparticles are unable to provide a collective function.

Figure 5A:
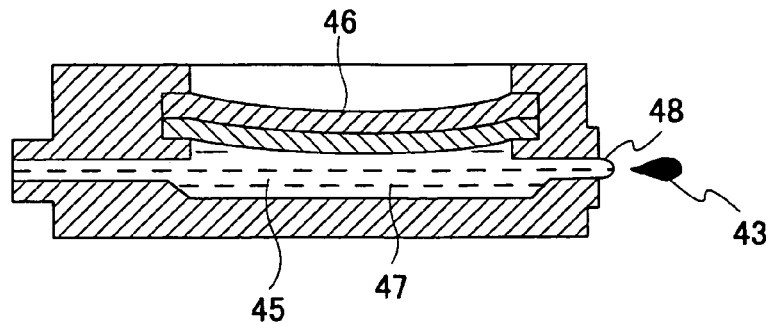
Figure 5B:
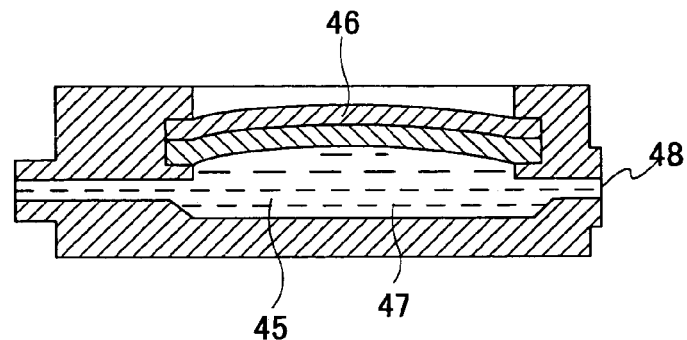

Next, a liquid jet head according to an embodiment of the present invention is described with reference to FIGS. 5A, 5B and 6.

This liquid jet head is one provided with piezoelectric devices 46 as an energy action unit within a flow route 45 wherein the solution 47 is introduced. If a pulse signal voltage is applied to the piezoelectric devices 46 to warp the piezoelectric devices 46 as shown in FIG. 5A, the capacity of the flow route 45 reduces as well as a pressure wave occurs, whereby that pressure wave causes the droplet 43 to be ejected out of the nozzle 48. FIG. 5B illustrates a state where the piezoelectric devices 46 are no longer warped and the capacity of the flow route 45 is increased.

Here, the solution 47 that is introduced into the flow route 45 adjacent to the nozzle 48 has passed through the filter 49. As described thus far, with the present invention, the filter 49 is provided within the jet head to realize a filter removing function at the nearest possible location to the nozzle 48. Therefore, foreign particles larger than the conductive fine particles or nanoparticles in the solution of the present invention can be trapped and prevent such foreign particles from adversely affecting the formation of patterns on a substrate or deteriorating the function of a functional device. By making the filter 49 as a compact and simple filter, the filter 49 can be embedded in the jet head 11 as shown in FIG. 6. Accordingly, the jet head 11 can then be made compact.

For example, a stainless mesh filter may preferably be used as the filter 49. Resin material such as Teflon (registered trademark) (4 ethylene fluoride) or polypropylene may also be used. In other words, the material should accordingly be selected in consideration of compatibility with the solution of the present invention (e.g. dissolving property, corrosion). Further, the pore size (or filter mesh size) of the filter should be selected so that a foreign material (foreign particle) that is 30 times or more the size of a fine particle in the solution can be trapped by the filter.

More specifically, since the present invention generally uses a solution containing fine particles with a diameter of 0.0005 to 0.2 µm (0.5 to 200 nm) (more preferably, a diameter of 0.0005 to 0.05 µm (0.5 to 50 nm)), the filter 49 is formed to trap a foreign material with a size no less than 0.015 to 0.6 µm (more preferably, no less than 0.015 to 1.5 µm). Thereby, the problem of foreign material clogging in the nozzles (openings) can be solved. Here, the mesh size of the filter 49 (size of foreign material that can be trapped) is described from the aspect of absolute material removal rate and not of average material removal rate.

Figure 6:
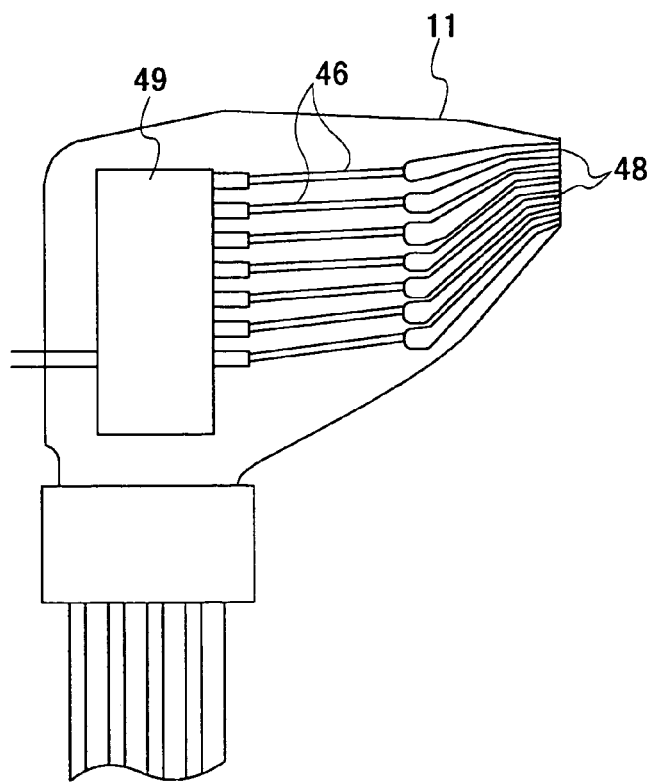
FIG. 6 is a drawing showing a structure of a jet head utilizing piezo elements for suitable used by the present invention.

Although FIG. 6 shows an example where the filter 49 is disposed inside the jet head 11, the filter 49 is not required to be disposed in the jet head 11 only. It is also possible to arrange a plurality of filters. In the present invention, the filter 49, which has a mesh size within the aforementioned range, is, for example, situated at an upstream portion of the nozzle and at a position nearest to the nozzle 48. The filter 49 is not only provided for a jet head ejecting a droplet by a mechanical displacement force, but also for a jet head ejecting a droplet by a bubble growth displacement force (e.g. thermal type, bubble type).

Next, another example of a liquid jet head that is preferably used in the present invention is described with reference to FIGS. 7A through 7C. This example is a thermal type (bubble type) liquid jet head in which a bubble is generated instantaneously in the liquid, which acts on the solution to cause a droplet to be ejected from the liquid jet head.

The liquid jet head is a head called an edge-shooter type which is a type that jets droplets from an end portion of a solution flowing channel.

The liquid jet head in this example is shown having four nozzles. This jet head is formed by coupling a thermal element substrate 66 and a cover substrate 67. The thermal element substrate 66 has individual electrodes 69, a common electrode 70, and heating elements (energy creating members) 71, which are formed on a silicon substrate 68 by a wafer process.

Meanwhile, the cover substrate 67 has grooves 74, which become channels for guiding the solution containing a functional material, and a recess 75 that configures a common fluid chamber for reserving the solution, which is to be guided through the channels. The cover substrate 67 is combined with the thermal element substrate 66 as shown in FIG. 7A, whereby the channels and the common fluid chamber described above are created. When the thermal element substrate 66 and the cover substrate 67 are coupled to each other, the thermal elements 71 are positioned in the bottom of the channels. In this state, nozzles 65 are formed at the ends of the channels to eject a portion of the solution guided through these channels as fluid (liquid) droplets. In addition, a solution inlet port 76 is formed in the cover substrate 67 to allow supply of solution into the solution supply chamber using supply unit (not shown). Although the shape of the nozzles 65 in this example is rectangular, the shapes may be round.

Taking jetting stability into consideration, the nozzle 65 may also be provided with a separate nozzle plate at an end face (portion of the nozzle 65) thereof, a desired nozzle diameter, and/or a desired nozzle shape. The nozzle plate may use a material such as Ni and may be formed with high precision by using, for example, an electro-forming technique. Further, nozzle (nozzle holes) may be formed, for example, by performing an excimer laser process on a resin film (substrate).

In the present invention, plural droplets are employed for forming a functional element, or for forming a pattern of a functional element or the like by overlapping and contacting of dots. Therefore, functional elements can be effectively formed by using a multi-nozzle type liquid jet head. In this example, a four-nozzle jet head is shown. Of course, it is not always necessary to have four nozzles. It is naturally understood that a greater number of nozzles will allow functional elements to be formed more efficiently. Nevertheless, this does not mean that the number of nozzles is simply increased. As the number of nozzles increases, the cost of the liquid jet head increases and clogging is more likely to occur in the jet nozzles. Accordingly, the above-described factors should be determined, taking into account the overall balance of the apparatus (including the balance of the cost and the fabrication efficiency).

Figure 8:
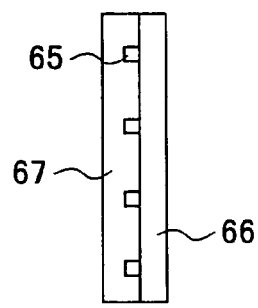
FIG. 8 is a drawing of a multi-nozzle type jet head when viewed from a nozzle side.
Figure 9:
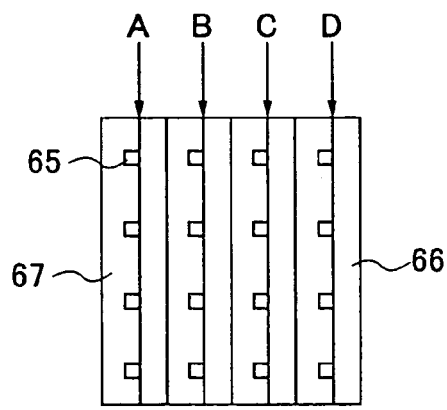
FIG. 9 is a drawing where multi-nozzle type jet heads corresponding to respective solutions are stacked to form a unit.
Figure 10:
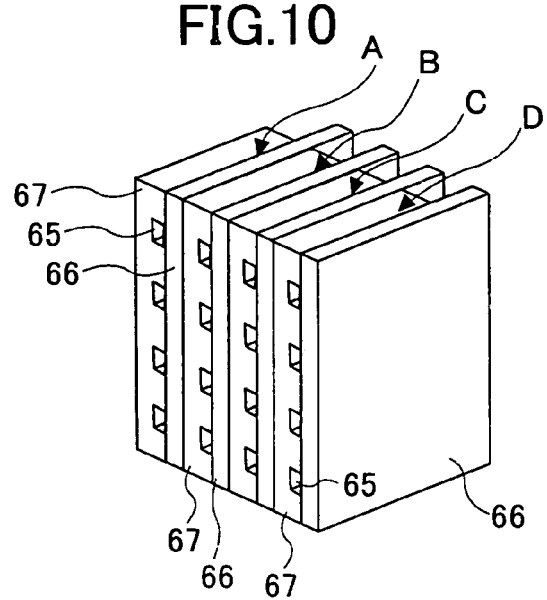
FIG. 10 is a perspective view showing jet heads in a unit state.

FIG. 8 shows a view of the multi-nozzle fluid jet head fabricated as described above when seen from the nozzle. In the present invention, such a multi-nozzle jet head is provided for each type of solution to be ejected, and a plurality of multi-nozzle jet heads are loaded on the carriage, as illustrated in FIG. 9. FIG. 10 is a perspective view thereof.

In FIGS. 9 and 10, each of the multi-nozzle fluid jet heads are assigned reference symbols A, B, C, and D. The nozzles of each of the jet heads A, B, C, and D are arranged apart from the nozzles of other jet heads, and these jet heads are filled with solutions containing different kinds of solutions (e.g. solution containing conductive fine particles, solution containing nanoparticles).

According to an embodiment of the present invention, a functional device is fabricated by applying a solution containing conductive fine particles or a solution. However, the fabrication of the functional device is not limited to using a single kind of solution, but instead, various different types of solutions can be employed for jetting. Therefore, a device structure body having a combination of a solution for forming electrode patterns and a solution for forming functional devices can be easily obtained.

Next, another feature of the present invention will be described. As described above, in the present invention, the solution, being employed for forming wiring patterns and/or functional devices according to the present invention, is a solution containing nanoparticles. And the solution is jetted from a minute discharge opening (nozzle) by a technology similar to the ink-jet principle. The technology is related to a technology forming patterns on a substrate. An ink used in a conventional ink-jet recording field dissolves dye in the solution. Compared with the ink used in the conventional ink-jet recording medium, in the solution used in the present invention, the nanoparticles are simply dispersed in the solution. As a result, a clogging problem is easily caused.

Furthermore, in the present invention, in a viewpoint of usage of a pattern or device that is needed, the jet head having a nozzle diameter that had not existed conventionally, for example, a nozzle diameter equal to or less than $\Phi 20$ $\mu m$ (smaller than a 300 $\mu m^2$ area) is required to use. Thus, this clogging problem becomes serious.

The clogging is originated from a principle in that the solution is jetted from the minute discharge opening (nozzle). That is, this is a reason why the discharge opening (nozzle) is minute. Accordingly, the size of the discharge opening (nozzle) has a close relationship with the size to the nanoparticle that can be a foreign object in the solution.

In the present invention, considering this point, the size of the discharge opening (nozzle) and the size of the nanoparticle have been focused on and a relationship between a difficulty of causing the clogging and the sizes of the discharge opening (nozzle) and the nanoparticle have been found out. As described above, the present invention generally uses, for example, a solution containing fine particles with a particle diameter of 0.0005 to 0.2 m (0.5 to 200 nm) and more preferably, 0.0005 to 0.05 $\mu m$ (0.5 to 50 nm).

Although the particles are sized minutely, in the final process of providing the solution containing the fine particles, the fine particles tend to aggregate and become into cluster-like form with a size of 0.05 to 5 $\mu m$. Considering a case where, for example, 100 through 1000 individual separate fine particles are formed as a chained straight line (row) after being subjected to the foregoing process, its length would be, for example, 0.05 to 5 $\mu m$ or 0.5 to 50 $\mu m$, to thereby cause nozzles to clog.

Actually, the fine particle not only become chained (anistropic) but as a cluster-shaped aggregate. From the aspect of numbers, several hundreds to several thousands of pigment aggregating in an isotropic manner. Although it may depend on the size of the cluster-shaped fine particle aggregate, the solution jet type fabrication apparatus according to the present invention may face the problem of nozzle clogging.

This raises a question of how many particles aggregate to cause the nozzle clogging. The inventor of the present invention assumed a case of a line (row) of 400 fine particles with a size of 0.05 $\mu m$. In this case, the maximum length was 20 $\mu m$, and leading to a conclusion that the clogging is likely to be caused when such aggregate is disposed in the proximity of the nozzle. Studies have been made regarding the condition of clogging in a case where the nozzle diameter is no more than $\Phi 20$ $\mu m$.

In detail, solutions including the nanoparticle having a different particle diameter were conducted. The jet head, in that the size of the discharge opening (nozzle) was known, was used. After the consecutive droplet jet for a prescribed time, the jet head had been left for a prescribed time, the droplet jet was conducted again, and then it was checked whether the discharge opening (nozzle) is clogged. In this case, this examination was made in that not only a complete clogging of the discharge opening (nozzle) but also a partial clogging of the discharge opening (nozzle) was recognized as the clogging.

The jet heads used in this examination are jet heads using piezo elements as a force for jetting liquid droplets, as shown in FIGS. 5 and 6. That is, the mechanical change of the piezo elements, being a change in the vibration plate of a liquid chamber, generates a force of jetting liquid droplets from the fine discharge opening (nozzle).

Although not shown in the drawings, the jet heads used in this examination are mounted with a nozzle plate having discharge openings (nozzles) provided on a nozzle plane thereof. For the sake of convenience, seven discharge openings (nozzles) are shown (See FIG. 6). In the experiment, the jet head having 64 discharge openings (nozzles) was actually used and an arrangement density of these discharge openings (nozzles) was 100 dpi. In addition, the drive voltage of a droplet jet was 20V, and the drive frequency was 10 kHz. Jet heads H1 through H4 were prepared (discharge opening (nozzle) diameters of the jet heads H1 through H4 were $\Phi 20$ $\mu m$, $\Phi 15$ $\mu m$, $\Phi 10$ $\mu m$, and $\Phi 5$ $\mu m$, respectively). In addition, the nozzle plate was a nozzle plate formed by an electro-forming method for Ni material. And a board thickness of the discharge opening (nozzle) was 25 $\mu m$.

The solution used in the experiment was made in a manner described below. A water soluble polymer is dissolved in silver nitrate, added with dimethylaminoethanol while being agitated, subjected to reduction of metal ions in three minutes, and subjected to eduction of Ag fine particles having an average diameter no more than 0.5 $\mu m$ (500 nm). Then, chlorine ions or nitrate ions, for example, are removed by an ultrafiltration membrane, and then subjected to concentration/drying, to thereby obtain a solution containing concentrated Ag fine particles.

Further, the solution containing concentrated Ag fine particles is dissolved in acetone, added with alkanolamine while being agitated, and subjected to eduction of Ag fine particles dispersed in the polymer toward an oil phase. The concentrated/dried solution containing concentrated Ag fine particles is dissolved/mixed with a mixed solvent of water, alcohol, and ethylene glycol, to thereby obtain the solution for jetting. It is to be noted that Ag fine particles with an average diameter of 0.0001 $\mu m$ through 0.5 $\mu m$ were obtained by using a centrifugal separator for obtaining a solution with Ag fine particles of different sizes. Nevertheless, Ag fine particles with an average diameter of 0.0003 $\mu m$ or less could not be evaluated (although included in the experiment) owing that the particles were unstable. It is to be noted that each solution included 10% Ag fine particles by weight, and 20% resin part by weight. Further, the viscosity of each solution was standardized with 20 centipoise by adjusting the adding amount of ethylene glycol.

In the examination, respective solutions with different Ag fine particles were employed to the jet heads H1 through H4, and droplets thereof were jetted consecutively for 10 minutes. Then, the jet heads H1 through H4 were left for 10 hours under an atmosphere with a temperature of 40° C. and a humidity of 30%. Then, jetting was conducted again with the jet heads H1 through H4 so as to examine the creation of clogging. The results of the examination are shown in Tables 1 through 4.

Table 1 shows a case of using the jet head H1 (nozzle diameter Do=Φ20 μm). Table 2 shows a case of using the jet head H2 (nozzle diameter Do=Φ15 μm). Table 3 shows a case of using the jet head H3 (nozzle diameter Do=Φ10 μm). Table 4 shows a case of using the jet head H4 (nozzle diameter Do=Φ5 μm). A determination "o" indicates that the jet head can be used practically and properly, a determination "Δ" indicates that the jet head can be used but not be proper, and a determination "x" indicates that the jet head cannot be used practically.

TABLE 1

Case of jet head H1 (nozzle diameter Do = Φ 20 μm)

| Solution | Diameter of Ag fine particle Dp (μm) | Dp/Do | Clogging State Clogged Discharge Openings/Total Discharge Openings | Determination |
|---|---|---|---|---|
| 1 | 0.0001 | 0.000005 | Not evaluated since not possible to produce stable solution | — |
| 2 | 0.0003 | 0.000015 | Not evaluated since not possible to produce stable solution | — |
| 3 | 0.0005 | 0.000025 | 0/64 | ○ |
| 4 | 0.001 | 0.00005 | 0/64 | ○ |
| 5 | 0.002 | 0.0001 | 0/64 | ○ |
| 6 | 0.004 | 0.0002 | 0/64 | ○ |
| 7 | 0.006 | 0.0003 | 0/64 | ○ |
| 8 | 0.01 | 0.0005 | 0/64 | ○ |
| 9 | 0.02 | 0.001 | 0/64 | ○ |
| 10 | 0.05 | 0.0025 | 0/64 | ○ |
| 11 | 0.07 | 0.0035 | 0/64 | ○ |
| 12 | 0.1 | 0.005 | 0/64 | ○ |
| 13 | 0.15 | 0.0075 | 0/64 | ○ |
| 14 | 0.2 | 0.01 | 0/64 | ○ |
| 15 | 0.25 | 0.0125 | 4/64 (partially clogged) | Δ |
| 16 | 0.3 | 0.015 | 19/64 (completely clogged) | X |
| 17 | 0.5 | 0.025 | 35/64 (completely clogged) | X |

TABLE 2

Case of jet head H2 (nozzle diameter Do = Φ 15 μm)

| SoluTion | Diameter of Ag fine particle Dp (μm) | Dp/Do | Clogging State Clogged Discharge Openings/Total Discharge Openings | Determination |
|---|---|---|---|---|
| 1 | 0.0001 | 0.000007 | Not evaluated since not possible to produce stable solution | — |
| 2 | 0.0003 | 0.00002 | Not evaluated since not possible to produce stable solution | — |
| 3 | 0.0005 | 0.000033 | 0/64 | — |
| 4 | 0.001 | 0.000067 | 0/64 | — |
| 5 | 0.002 | 0.000133 | 0/64 | ○ |
| 6 | 0.004 | 0.000267 | 0/64 | ○ |
| 7 | 0.006 | 0.0004 | 0/64 | ○ |
| 8 | 0.01 | 0.00067 | 0/64 | ○ |
| 9 | 0.02 | 0.00133 | 0/64 | ○ |
| 10 | 0.05 | 0.00333 | 0/64 | ○ |
| 11 | 0.07 | 0.00467 | 0/64 | ○ |
| 12 | 0.1 | 0.00667 | 0/64 | ○ |
| 13 | 0.15 | 0.01 | 0/64 | ○ |
| 14 | 0.2 | 0.0133 | 3/64 (partially clogged) | Δ |
| 15 | 0.25 | 0.0167 | 6/64 (completely clogged) | X |
| 16 | 0.3 | 0.02 | 25/64 (completely clogged) | X |
| 17 | 0.5 | 0.0333 | 44/64 (completely clogged) | X |

TABLE 3

Case of jet head H3 (nozzle diameter Do = Φ 10 μm)

| SoluTion | Diameter of Ag fine particle Dp (μm) | Dp/Do | Clogging State Clogged Discharge Openings/Total Discharge Openings | Determination |
|---|---|---|---|---|
| 1 | 0.0001 | 0.00001 | Not evaluated since not possible to produce stable solution | — |
| 2 | 0.0003 | 0.00003 | Not evaluated since not possible to produce stable solution | — |
| 3 | 0.0005 | 0.00005 | 0/64 | ○ |
| 4 | 0.001 | 0.0001 | 0/64 | ○ |
| 5 | 0.002 | 0.0002 | 0/64 | ○ |
| 6 | 0.004 | 0.0004 | 0/64 | ○ |
| 7 | 0.006 | 0.0006 | 0/64 | ○ |
| 8 | 0.01 | 0.001 | 0/64 | ○ |
| 9 | 0.02 | 0.002 | 0/64 | ○ |
| 10 | 0.05 | 0.005 | 0/64 | ○ |
| 11 | 0.07 | 0.007 | 0/64 | ○ |
| 12 | 0.1 | 0.01 | 0/64 | ○ |
| 13 | 0.15 | 0.015 | 6/64 (partially clogged) | Δ |
| 14 | 0.2 | 0.02 | 10/64 (completely clogged) | X |
| 15 | 0.25 | 0.025 | 15/64 (completely clogged) | X |
| 16 | 0.3 | 0.03 | 37/64 (completely clogged) | X |
| 17 | 0.5 | 0.05 | 64/64 (completely clogged) | X |

TABLE 4

Case of jet head H4 (nozzle diameter Do = Φ 5 μm)

| SoluTion | Diameter of Ag fine particle Dp (μm) | Dp/Do | Clogging State Clogged Discharge Openings/Total Discharge Openings | Determination |
|---|---|---|---|---|
| 1 | 0.0001 | 0.00002 | Not evaluated since not possible to produce stable solution | — |
| 2 | 0.0003 | 0.00006 | Not evaluated since not possible to produce stable solution | — |
| 3 | 0.0005 | 0.0001 | 0/64 | ○ |
| 4 | 0.001 | 0.0002 | 0/64 | ○ |
| 5 | 0.002 | 0.0004 | 0/64 | ○ |
| 6 | 0.004 | 0.0008 | 0/64 | ○ |
| 7 | 0.006 | 0.0012 | 0/64 | ○ |

TABLE 4-continued

Case of jet head H4 (nozzle diameter Do = Φ 5 μm)

| SoluTion | Diameter of Ag fine particle Dp (μm) | Dp/Do | Clogging State Clogged Discharge Openings/Total Discharge Openings | Determination |
|---|---|---|---|---|
| 8 | 0.01 | 0.002 | 0/64 | ○ |
| 9 | 0.02 | 0.004 | 0/64 | ○ |
| 10 | 0.05 | 0.01 | 0/64 | ○ |
| 11 | 0.07 | 0.014 | 9/64 (partially clogged) | Δ |
| 12 | 0.1 | 0.02 | 3/64 (completely clogged) | X |
| 13 | 0.15 | 0.03 | 24/64 (completely clogged) | X |
| 14 | 0.2 | 0.04 | 46/64 (completely clogged) | X |
| 15 | 0.25 | 0.05 | 64/64 (completely clogged) | X |
| 16 | 0.3 | 0.06 | 64/64 (completely clogged) | X |
| 17 | 0.5 | 0.1 | 64/64 (completely clogged) | X |

Referring to the above results, in a case in that the jet head having the nozzle diameter being from Φ5 μm to Φ20 μm is used, when the diameter of Ag fine particle Dp and the nozzle diameter Do satisfy a relationship of Dp/Do≦0.01, it is possible to obtain stable droplet jet without clogging. Even if a lower limit of Dp/Do is satisfied, it is difficult to stably disperse extremely minute fine particles in the solution when the diameter of the Ag fine particle Dp is equal to or less than 0.0003 μm. Moreover, in order for all the jet heads having the nozzle diameter equal to or less than Φ20 μm to stably conduct the droplet jet, the lower limit of Dp/Do can be set to 0.0001 as a safe limit. That is, if the diameter of the Ag fine particle Dp and the nozzle diameter Do satisfy the relationship of 0.00011≦Dp/Do≦=0.01, a stable dispersed solution can be produced so that a pattern or a device can be formed by the droplet jet using the jet head which nozzle diameter is equal to or less than Φ20 μm. Therefore, the clogging problem can be prevented.

In this experiment, the discharge opening (nozzle) being round was used. In a case of another shape, an area of another shape may be simply compared. For example, an 18 μm×18 μm rectangle discharge opening (nozzle) substantially corresponds to the Φ20 μm discharge opening (nozzle) being round in the present invention. In other words, the present invention can be applied to a case in that the jet head using the nozzle which area is smaller than 300 μm$^2$ (nozzle area lower limit of substantially 20 μm$^2$ (nozzle diameter Φ5 μm)) and a pattern or a device is formed by jetting the above-described solution.

In a case where the nozzle diameter is larger than Φ20 μm, for example, a case where the nozzle diameter is Φ100 μm, no problem of clogging is caused since the nozzle is large enough against aggregated fine particles. In an actual case (although not shown in the data), no clogging was observed when the nozzle diameter was Φ100 μm where the size of the fine particles in the solution was 0.0005 to 0.05 μm.

Although a jet head using piezo elements as the source of jetting droplets (mechanical displacement force) was employed in the experiment, another jet head which also ejects droplets by mechanical displacement force may also be employed. For example, there is a jet head using electrostatic force between two electrodes so as to generate a mechanical displacement force with vibration plates in a liquid chamber. Since these jet heads eject droplets by applying a mechanical displacement force to the liquid, there is little restriction on the type of liquid to be used. In addition, since these jet heads are mechanically changed in an analog manner, the ejected droplet can be formed into a round shape by controlling the drive waveform. Such round shaped droplet enables a satisfactory dot pattern to be formed, as in the present invention.

Furthermore, a jet head (thermal bubble type head) instantaneously generating a bubble for jetting droplets also shares the problem of clogging, owing that clogging is caused by jetting the solution containing fine particles from minute nozzles. Therefore, the foregoing experiment results can also be applied for the head of thermal type (bubble type). Or a continuous flow type which continuously applies electric charge to an ejected droplet, and deflects the droplet according to the amount of the charge.

Since the jet heads, which utilizing bubble growth displacement force for ejecting a droplet (e.g. thermal type jet head), manipulate heat, the solution used for such jet heads face some restrictions owing to, for example, deterioration from heat.

The type which generates bubbles for jetting (e.g. thermal head type) may include and have its nozzles disposed in high density and high concentrated alignment. For example, an alignment density of 600 dpi through 1200 dpi or more, and a nozzle number of 500 through 1000 nozzles can be provided, and a highly efficient fabrication apparatus can be obtained.

Next, another feature according to the present invention is described. As described above, the present invention is able to provide stable jetting of a solution containing fine particles without encountering clogging of nozzles. The results described below show how the jetted droplets of the solution can suitably adhere to the substrate to thereby form a satisfactory pattern or device.

In this example, the jet head unit 11 forms a pattern or a functional device array while moving in the X and Y directions relative to the substrate 14 so as to keep parallel to the pattern or functional device forming surface with a fixed distance from the substrate 14. That is, with respect to the substrate 14, the jet head unit 11 is moved in parallel to the substrate surface or, the substrate 14 is moved in parallel to the jet head unit 11.

In this case, it is possible to form high precision patterns or an array of functional devices where the relative traveling between the jet head and the substrate is ceased each time ejection of droplets of the solution containing fine particles is conducted for forming the patterns or array of functional devices. However, ceasing the relative traveling will cause considerable decrease in productivity. Therefore, in the present invention, droplets are ejected while continuing the relative traveling in order to improve the productivity. The relative traveling speed between the jet head and the substrate (for example, the moving speed of the carriage in the X direction in FIG. 2) is determined not only from the viewpoint of improving the productivity, but also from the viewpoint of precise device formation on the substrate.

As a result of detailed study regarding the pattern or device formation using an inkjet technique, it was found that the ejection speed of the droplet has to be set greater than the relative traveling speed of the jet head unit 11. Since a droplet is ejected to form a pattern or functional device, while moving the jet head unit 11 in the X and Y directions relative to the substrate 14 with a certain distance between them, the velocity of the droplet is defined as a composite vector of the ejection velocity and the relative traveling velocity of the jet head. As for the positioning accuracy of the droplet, it is possible to control the droplet so as to reach the target position by appropriately selecting the jet timing, taking into consideration the distance between the substrate 14 and the surface of the fluid jet aperture in the jet head unit 11, and the velocity of the composite vector.

Nevertheless, even when the droplet is well-controlled so as to reach the intended location, if the relative velocity is too large, the droplet may be pulled by the relative velocity and run on the substrate 14. In this case, a pattern or a group of functional device cannot be fabricated in a satisfactory shape. The present invention incorporates consideration of this point. The results of this testing are shown below. In this example, an apparatus shown in FIG. 2 was used, and the traveling speed of the carriage 12 in the X-direction and the ejection speed of the jet head unit 11 were varied to study whether or not the droplet reaches the substrate 14 in good condition so as to form a satisfactory pattern.

Figure 11A:
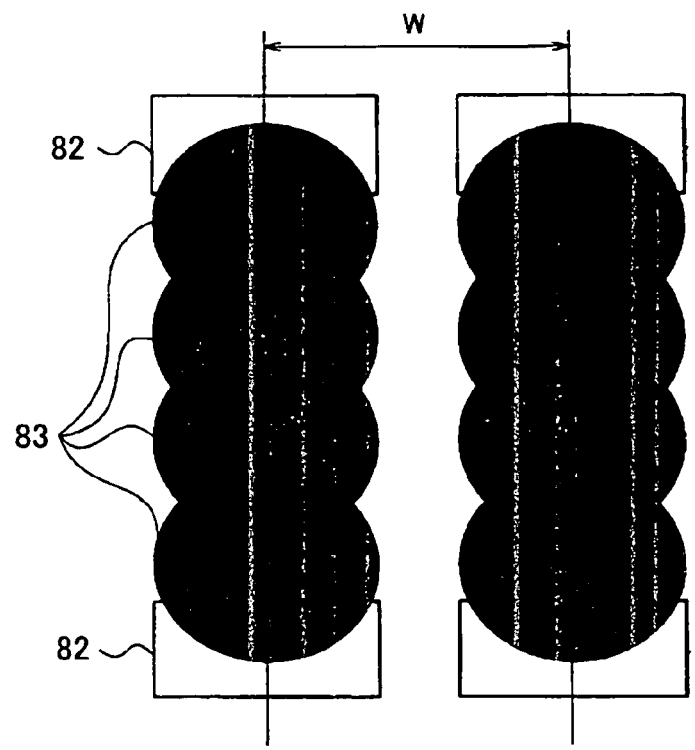
FIGS. 11A and 11B are drawing showing an example of a test pattern used for obtaining conditions for performing a satisfactory pattern formation.
Figure 11B:
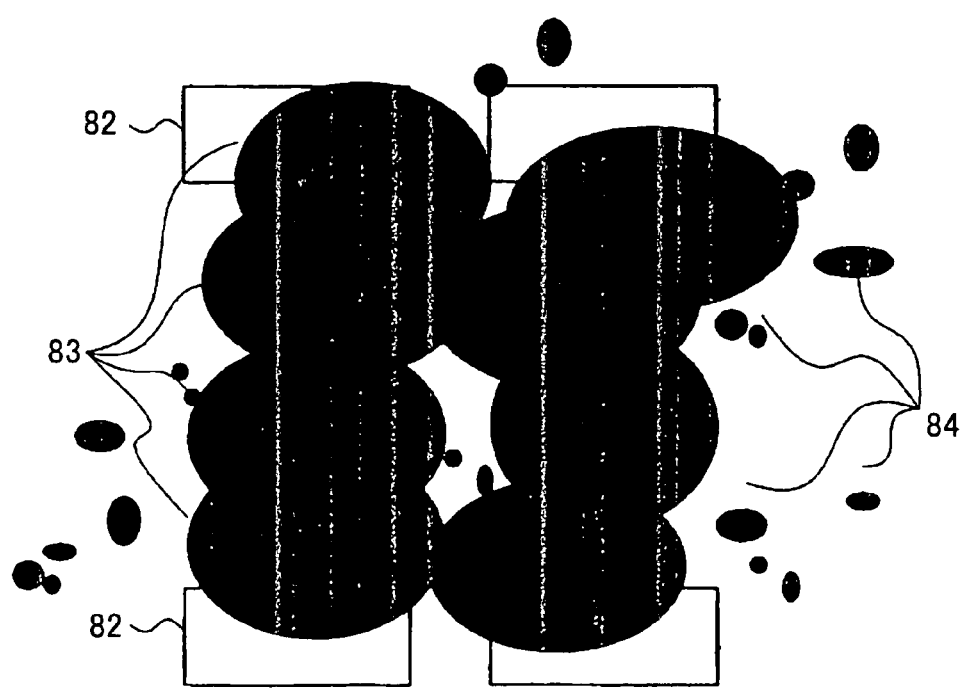

FIG. 11A and FIG. 11B are diagrams showing patterns used in the examination. In this case, the solution containing a solution containing Ag fine particles was jetted, the wiring pattern connecting the dot pattern 83 formed by the solution was formed on two rows of electrodes being adjacent each other (between ITO transparent electrodes 82). Then, a formation state of the pattern was evaluated. This evaluation was conducted by observing the pattern by using a microscope and it was checked whether or not the pattern was properly formed (○/X). In FIG. 11A, a proper formation is shown (○). In FIG. 11B, each dot patter is not formed to be a proper round, in which, when the dot patter becomes oval, displaces from the target location on the substrate, or contacts with an adjacent dot, it is determined that the dot pattern is not properly formed (X) Moreover, when minute droplets is observed scattering about (although this often occurs in an initial stage of clogging or in deterioration of jet performance due to factors such as scratches at the nozzle), it is also determined that the dot pattern is not properly formed (X).

In addition to this evaluation of the dot shape, a resistance value was measured at an upside and a downside between the ITO transparent electrodes 82, and a resistance value fluctuation by a disconnection caused by an imprecise dot location or a contact with the adjacent dot (right or left dot) was evaluated ("o" denotes an on-target resistance and "x" denotes an out-target resistance).

Details of an experimental condition will be described. A substrate used in this experiments was a glass substrate attached with the ITO transparent electrode 82, and a pattern was formed so as to form a dot pattern 83 (as shown in FIGS. 11A and 11B) by combining the solution containing Ag fine particles (in this experiment, the fine particle diameter was 0.01 μm) with the jet head H4. For the purpose of simplification, FIGS. 11A and 11B show the pair of the ITO transparent electrodes 82 connected with 4 dots to form the pattern. However, actually, approximately 1000 dots (dot size of approximately Φ8 μm, pitch of approximately 4 μm) were vertically embedded in a single row to connect the ITO transparent electrodes 82 (space of 4 mm between the electrodes) situated above and below each other. In addition, a similar pattern was formed adjacently to the pattern so as to connect the ITO transparent electrodes 82 and interval between the ITO transparent electrodes 82 in that a center-to-center distance was defined as 12 μm.

The jet head H4 used in the experiment has 64 nozzles with an alignment density of 100 dpi. The jet head and the substrate were relatively moved (in this experiment, the substrate was fixed and the jet head was scanned with the carriage), in which the relative movement was controlled by a μ order. Further, the jet timing was also controlled. Thereby, conducting pattern formation of dots with a pitch of approximately 4 μm, while maintaining the center-to-center distance of 12 μm.

The inkjet head used is an inkjet head utilizing piezo elements, wherein the input voltage to the piezo element was varied from 14 V to 21 V in order to change the ejection velocity. The drive frequency was given as 10 kHz. With such inkjet head using piezo elements, the ejection velocity can be changed by changing the voltage applied to the piezo elements. However, since the mass of the ejected droplet also changes in accordance with the change in applied voltage, the drive waveform (defined by the rising edge and the falling edge of the pulse, including for ejection while moving backwards) was adjusted so that the mass of the jet droplet was always substantially constant (in this case, 1 pl), and so that only the ejection velocity varied.

Figure 12:
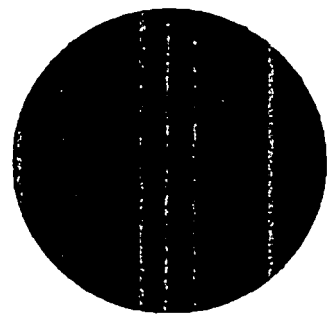
FIG. 12 is a drawing for explaining an example of a shape of a flying droplet when ejected by mechanical displacement force of a jet head of a solution jet type fabrication apparatus according to the present invention.
Figure 12:
Figure 13:
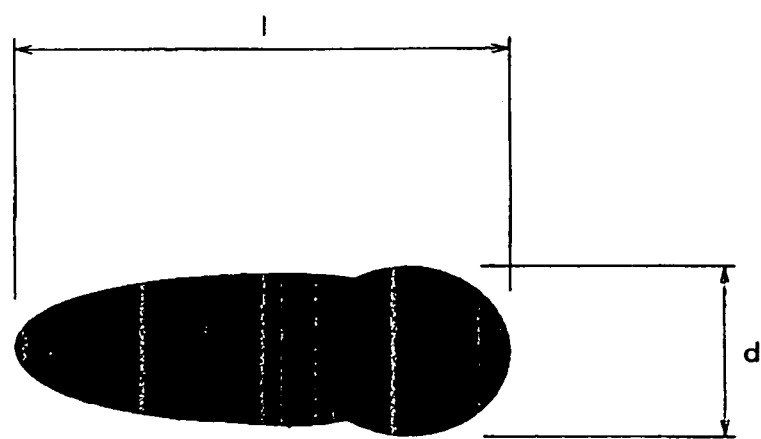
FIG. 13 is a drawing for explaining another example of a shape of a flying droplet when ejected by mechanical displacement force of a jet head of a solution jet type fabrication apparatus according to the present invention.
Figure 13:

A fluid droplet was separately ejected under the same conditions as the actual device formation, and the shape of the droplet during the flight was observed. Then, a droplet was ejected while controlling the drive waveform so that the droplet became substantially round, as shown in FIG. 12, immediately before the droplet reached the substrate surface (in this example, after 3 mm flight). Even if a perfectly round sphere cannot be obtained, and instead, an elongated droplet extending along the path of flight is obtained as shown in FIG. 13, the length of the elongated droplet can be easily set, for example, equal to or smaller than three times the diameter ($1 \leq 3$ d) simply by controlling the driving waveform. That is, the length of the elongated droplet in the ejecting direction may be set, for example, no more than three times the length of the elongated droplet in a direction perpendicular to the ejecting direction. The drive conditions (including the drive waveform) were chosen so that there were no minute droplets 81 shown in FIG. 14 trailing behind the flying droplet (which is often observed in a case of jetting a solution by utilizing a growth displacement force of a film boiling bubble).

TABLE 5

| Experiment No. | Jet Velocity Vj (m/s) | X Direction Movement Velocity Of Carriage Vc (m/s) | Pattern Formation State | Resistance |
|---|---|---|---|---|
| 1 | 3 | 1 | ○ | ○ |
| 2 | 3 | 2 | ○ | ○ |
| 3 | 3 | 3 | X | X |
| 4 | 3 | 4 | X | X |
| 5 | 5 | 1 | ○ | ○ |
| 6 | 5 | 2 | ○ | ○ |
| 7 | 5 | 3 | ○ | ○ |
| 8 | 5 | 4 | ○ | ○ |
| 9 | 5 | 5 | X | X |
| 10 | 5 | 6 | X | X |
| 11 | 7 | 2 | ○ | ○ |
| 12 | 7 | 3 | ○ | ○ |
| 13 | 7 | 4 | ○ | ○ |
| 14 | 7 | 5 | ○ | ○ |
| 15 | 7 | 6 | ○ | ○ |
| 16 | 7 | 7 | X | X |
| 17 | 7 | 8 | X | X |
| 18 | 10 | 4 | ○ | ○ |
| 19 | 10 | 6 | ○ | ○ |
| 20 | 10 | 8 | ○ | ○ |
| 21 | 10 | 10 | X | X |
| 22 | 10 | 12 | X | X |
| 23 | 10 | 14 | X | X |

The above results show that favorable element formation cannot be achieved any longer when the traveling velocity of the carriage in the X-direction becomes equal to the jet velocity or exceeds it. To put it another way, in the case of forming a wiring pattern or a functional device by jetting and drying a solution containing nanoparticles on a substrate by using a inkjet head with piezo elements, the velocity of the fluid droplet ejected from the jet head must be set greater than the traveling velocity of the carriage in the X-direction.

Although the jet head was moved with scanning of the carriage in the experiment, this example also applies to a case of fixing the jet head (jet head unit 11) while moving the substrate as shown in FIG. 3. That is, the velocity of the ejected fluid droplet must be set greater than the relative movement of the jet head and the substrate.

Furthermore, by so setting, an excellent functional device and an excellent functional device mounting board can be obtained without any minute droplets 81 (See FIG. 14) attached on the substrate because the droplet flight conditions are chosen so that no minute droplets 81 are caused to trail behind the flying droplet.

Furthermore, even if the flying droplet is elongated in a manner extending along the flight path, the length of the elongated droplet can be easily set, for example, equal to or smaller than three times the diameter ($1 \leq 3$ d) as shown in FIG. 13 by controlling the driving waveform. That is, the length of the elongated droplet in the ejecting direction may be set, for example, no more than three times the length of the elongated droplet in a direction perpendicular to the ejecting direction. Thereby, a dot can be formed with a shape close to a perfect round shape and enable satisfactory pattern formation.

Other than the foregoing inkjet technique using piezo elements to jet fluid droplets by mechanical propagation (mechanical displacement force), there is also the inkjet technique using a growth displacement force of a film boiling bubble. In the case of jetting a droplet by using growth displacement force of a film boiling bubble, the shape of during flight of the droplet.

Figure 14:
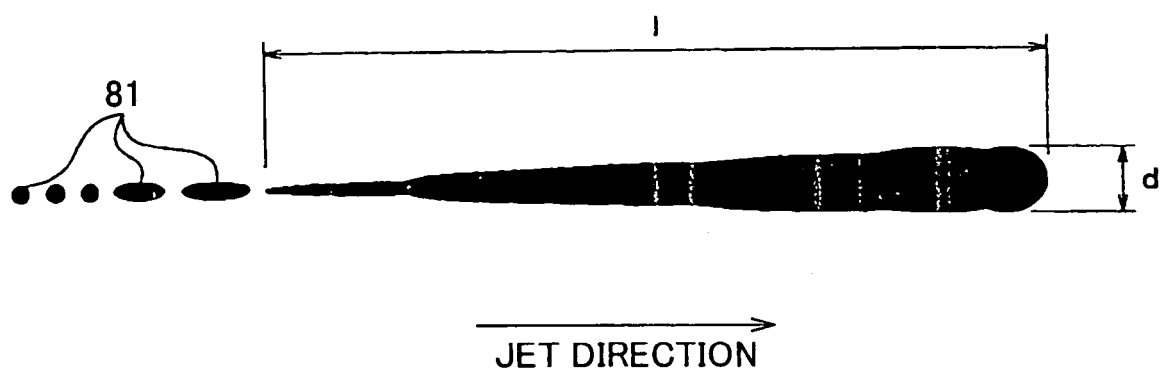
FIG. 14 is a drawing for explaining an example of a shape of a flying droplet when ejected by bubble growth displacement force of a jet head of a solution jet type fabrication apparatus according to the present invention.

The difference in the form of the flying droplet of FIG. 14 and that of FIGS. 12 and 13 (which are diagrams where the solution is jetted with the piezo-jet method for jetting by a mechanical displacement force in that the piezoelectric element is recognized as a moving force of discharging a droplet).

In the case of FIG. 14, a jet pressure is higher and a jet velocity is faster than the piezo-jet method for jetting by the mechanical displacement force wherein the piezoelectric element (the case of FIGS. 12 and 13) is defined as the moving force of the droplet discharge in order to immediately heat a part of the solution at from 300° C. to 400° C. (within a few μs), to occur the film boiling bubble, and to jet the solution by utilizing an immediate growth (within a few μs) and a pressure increase (displacement force) of the film boiling bubble.

As a result, as shown in FIG. 14, a jet shape of the solution has features in that the droplet extends in a jet direction while forming to be a slender pole shape and the solution is jetted with a plurality of minute droplets at a rear portion thereof at a high speed, when the solution is jetted. For example, generally, when the solution (droplet) is jetted by producing a stable film boiling bubble, a length l of the slender pole shape of the jet shape of the solution becomes, for example, no less than five times a diameter d (that is, the length of the elongated droplet in the ejecting direction being, for example, no less than five times the length of the elongated droplet in a direction perpendicular to the ejecting direction) and the solution is jetted approximately at from 5 m/s to 20 m/s.

As a result, advantageously, the jet can be stable and the dropped location of a jetted solution is accurately positioned on the substrate. On the other hand, if a relative movement velocity between the jet head and the substrate is not selected, the droplet forming the slender pole shape and extending toward the rear portion in the jet direction and the plurality of minute droplets following at the rear portion prevent to form the proper round dot.

Accordingly, in a similar manner as the liquid jet head using piezo elements to jet droplets by mechanical displacement force, detailed studies have been made from such view point. As a result, it was found that the ejection speed of the droplet has to be set greater than the relative traveling speed of the jet head unit in the case of jetting a droplet by using growth displacement force of a film boiling bubble.

In such case where a droplet is jet by using growth displacement force of a film boiling bubble, when the length l of the slender pole shape of the jet shape of the solution becomes, for example, no less than five times a diameter d (that is, the length of the elongated droplet in the ejecting direction being, for example, no less than five times the length of the elongated droplet in a direction perpendicular to the ejecting direction) and the solution is jetted approximately at from 5 m/s to 20 m/s, the jet can be stable. Such stable jet results to accurate positioning of droplets on the substrate.

However, even if the solution adheres at the target location, if the relative velocity between the jet head and the substrate is too large, the droplet may be pulled by the relative velocity and run on the substrate 14. Accordingly, a satisfactory pattern or group of functional devices cannot be formed. Moreover, the plurality of minute droplets 81 chaining toward the rear portion is displaced from the target location and randomly adheres in a scatter state. Accordingly, it is prevented to form the proper dot shape and a functional device performance is deteriorated. These disadvantages are examined in the present invention.

The results of this examining are shown below. Other than jetting a droplet by using growth displacement force of a film boiling bubble, the equipment, conditions, and the like are the same in examining with the jet head using the piezo elements. In this example, the apparatus shown in FIG. 2 was used, and the traveling speed of the carriage 12 in the X-direction and the ejection speed of the jet head unit 11 were varied to study whether or not the droplet reaches the substrate 14 in good condition so as to form a satisfactory pattern.

This evaluation was also conducted by observing the pattern by using a microscope and it was checked whether or not the pattern was properly formed (○/X). In FIG. 11A, a proper formation is shown (○) In FIG. 11B, each dot patter is not formed to be a proper round, in which, when the dot patter becomes oval, displaces from the target location on the substrate, or contacts with an adjacent dot, it is determined that the dot pattern is not properly formed (X). Moreover, when minute droplets is observed scattering about, it is also determined that the dot pattern is not properly formed (X).

In addition to this evaluation of the dot shape, a resistance value was measured at an upside and a downside between the ITO transparent electrodes 82, and a resistance value fluctuation by a disconnection caused by an imprecise dot location or a contact with the adjacent dot (right or left dot)

was evaluated ("o" denotes an on-target resistance and "x" denotes an out-target resistance).

Details of an experimental condition will be described. A substrate used in the experiments was a glass substrate attached with the ITO transparent electrode 82, and a dot pattern 83 was formed (as shown in FIG. 11A and FIG. 11B) by combining the solution containing Ag fine particles with the jet head shown in FIG. 7A through FIG. 7C. In this experiment, the fine particle used had a 0.01 μm diameter, and a multi nozzle plate formed by Ni electro-forming with a Φ5 μm nozzle size was additionally provided to the jet head. For the purpose of simplification, FIGS. 11A and 11B show the pair of the ITO transparent electrodes 82 connected with 4 dots to form the pattern. However, actually, approximately 1000 dots (dot size of approximately Φ8 μm, pitch of approximately 4 μm) were vertically embedded in a single row to connect the ITO transparent electrodes 82 (space of 4 mm between the electrodes) situated above and below each other. In addition, a similar pattern was formed adjacently to the pattern so as to connect the ITO transparent electrodes 82 and interval between the ITO transparent electrodes 82 in that a center-to-center distance was defined as 12 μm.

The jet head used in this experiment was the jet head above-described (four nozzles are shown in a simplified manner in FIG. 7 through FIG. 7C) but included 64 nozzles (discharge openings). In addition, the arrangement density (alignment density) was 400 dpi. The size of the heating element was 10 μm×40 μm, and the resistance value was 102 Ω. The drive voltage of the head was 11V, the pulse width was 2 μs, and the drive frequency was 14 kHz. A volume of a discharge droplet was approximately 1 pl.

Under this experimental condition, the pattern above-described was formed on the glass substrate. After the pattern was formed, the pattern was evaluated. In addition, under the same experimental condition, another discharge experiment was conducted, and then a discharge state of the solution being 3 mm away from the discharge opening (nozzle) was observed. This owes to the fact that the pattern of the device shown in FIG. 11A and FIG. 11B was produced where a distance was set as 3 mm between the substrate and the discharge opening (nozzle). As shown in FIG. 14, the jet state was the droplet forming the pole shape (l=5 d to 20 d) considerably extended in the jet direction (flight direction). The jet state also showed the droplet accompanying with the plurality of minute droplets at the rear portion in the jet direction. The result of this experiment will be shown as follows:

TABLE 6

| Experiment No. | Jet Velocity Vj (m/s) | X Direction Movement Velocity Of Carriage Vc (m/s) | Pattern Formation State | Resistance |
| --- | --- | --- | --- | --- |
| 1 | 6 | 1 | ○ | ○ |
| 2 | 6 | 2 | ○ | ○ |
| 3 | 6 | 3 | X | X |
| 4 | 6 | 4 | X | X |
| 5 | 6 | 6 | X | X |
| 6 | 6 | 8 | X | X |
| 7 | 6 | 10 | X | X |
| 8 | 6 | 12 | X | X |
| 9 | 9 | 1 | ○ | ○ |
| 10 | 9 | 2 | ○ | ○ |
| 11 | 9 | 3 | ○ | ○ |
| 12 | 9 | 4 | X | X |
| 13 | 9 | 6 | X | X |
| 14 | 9 | 8 | X | X |
| 15 | 9 | 10 | X | X |
| 16 | 9 | 12 | X | X |
| 17 | 12 | 1 | ○ | ○ |
| 18 | 12 | 2 | ○ | ○ |
| 19 | 12 | 3 | ○ | ○ |
| 20 | 12 | 4 | ○ | ○ |
| 21 | 12 | 6 | X | X |
| 22 | 12 | 8 | X | X |
| 23 | 12 | 10 | X | X |
| 24 | 12 | 12 | X | X |
| 25 | 18 | 1 | ○ | ○ |
| 26 | 18 | 2 | ○ | ○ |
| 27 | 18 | 3 | ○ | ○ |
| 28 | 18 | 4 | ○ | ○ |
| 29 | 18 | 6 | ○ | ○ |
| 30 | 18 | 8 | X | X |
| 31 | 18 | 10 | X | X |
| 32 | 18 | 12 | X | X |

Referring to the result shown in Table 6, when the x direction movement velocity of the carriage is greater than ⅓ the jet velocity, a proper device cannot be formed. In this experiment, a state of carrying the jet head to scan is illustrated. Alternatively, this experiment can be applied in a case in that the jet head can be fixed as shown in FIG. 3 and the substrate is moved. That is, the relative movement velocity between the jet head and the substrate is required to be equal to or less than ⅓ velocity of the solution that is jet.

Figure 15:
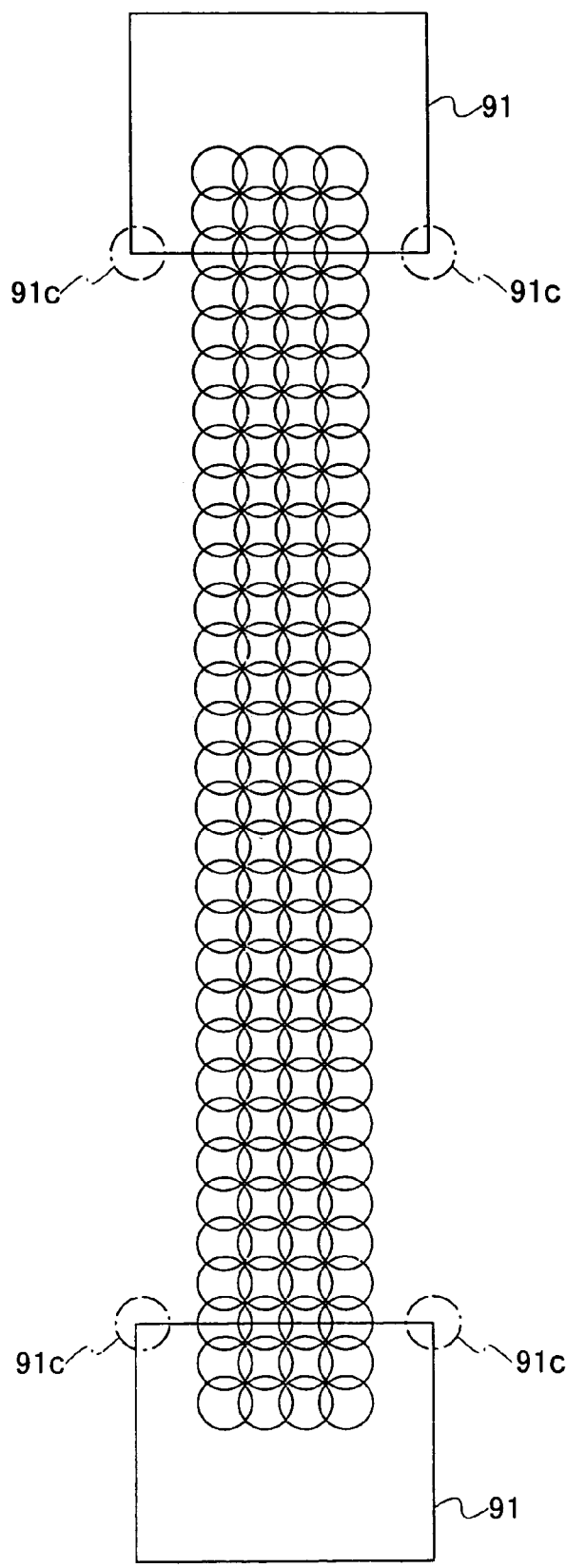
FIG. 15 is a drawing for explaining an example forming a wiring pattern combining droplets or dots of a solution according to a principle (technique) of the present invention.

Next, another feature according to the present invention is described. FIG. 15 shows an example of a wiring pattern formed on a wiring pattern substrate by using the inkjet technique according to the present invention. In the example, a wiring pattern 92 is formed by jetting a solution containing fine particles to a terminal pattern (electrode pattern) 91 which is formed, beforehand on the substrate, as a rectangular shape or a combination of rectangles. In this example, for the purpose of simplifying the drawing, the respective dots of the wiring pattern 92 are illustrated in a manner being tangent to another diagonally situated dot. However, the dots are actually arranged in higher density (arranged in a more overlapped manner) so that there are no uncoated areas in the wiring pattern portion.

Figure 16:
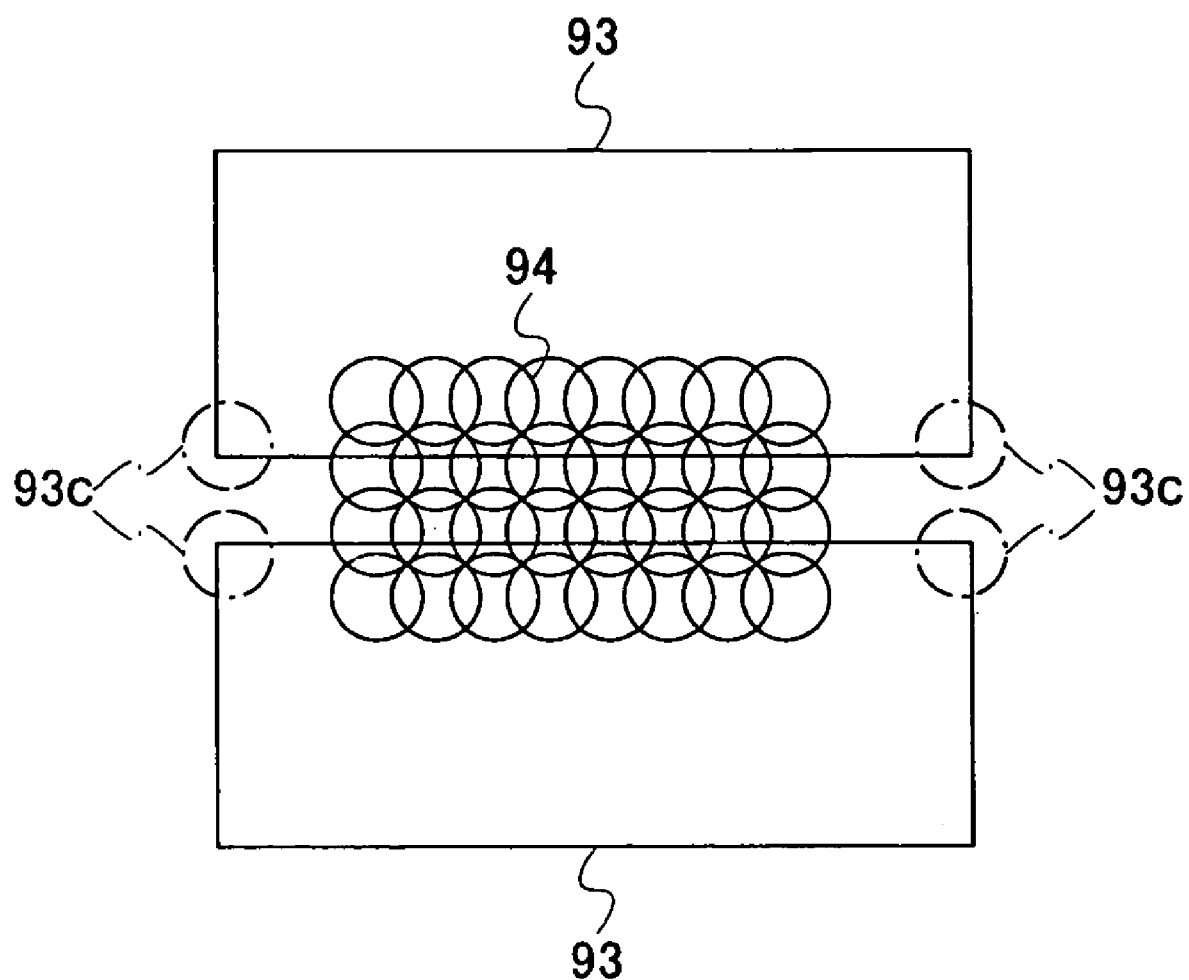
FIG. 16 is a drawing for explaining an example forming a device combining droplets or dots of a solution according to a principle (technique) of the present invention.

FIG. 16 shows an example of a device formed on a device substrate by using the inkjet technique according to the present invention. In the example, a device is formed by jetting a solution containing fine particles to a pair of device electrodes (electrode patterns) 93 which is formed, beforehand on the substrate, as a rectangular shape or a combination of rectangles.

However, the examples face a problem of abnormal electric discharge, which is generated at the terminal pattern 91 or the device electrode (electrode pattern) 93 during use after formation of a wiring pattern or various devices has been completed. This will be described with reference to FIGS. 15 and 16.

According to an embodiment of the present invention, the wiring pattern 92, being formed by dot patterns of a solution containing metal fine particle material, is arranged between plural (in this example, 2) terminal patterns (electrode patterns) 91, or various electronic devices, being formed by dot patterns 94 of a solution containing metal fine particle material, is arranged between opposite facing device electrodes 93. Typically, the terminal patterns 91 or the device electrodes (electrode patterns) 93 are formed, with a thin film of, for example, Al, Au, Cu, or an ITO thin film, and shaped to a desired pattern form by using techniques such as photolithography or etching. Further, the terminal patterns 91 or the device electrodes (electrode patterns) 93 are typically shaped as a rectangular pattern or a combination of rectangular patterns.

The shape of the electrode patterns 91, 93 depends on the shape of the photo mask used in the photolithography process result. Therefore, the electrode patterns 91, 93 are shaped as rectangular patterns or a combination of rectangular patterns (rectangular shapes are cost effective for manufacture). This, however, causes electric field to concentrate at corner portions 91C, 93C of the electrode patterns 91, 93 owing that the corner portions 91C, 93C are pointed. As a result, when the voltage is applied between the electrodes, an abnormal electric discharge is generated at the electric field concentrating portion. This prevents satisfactory device function from being obtained or causes defects such as damaging at the electric field concentrating portion.

Figure 17:
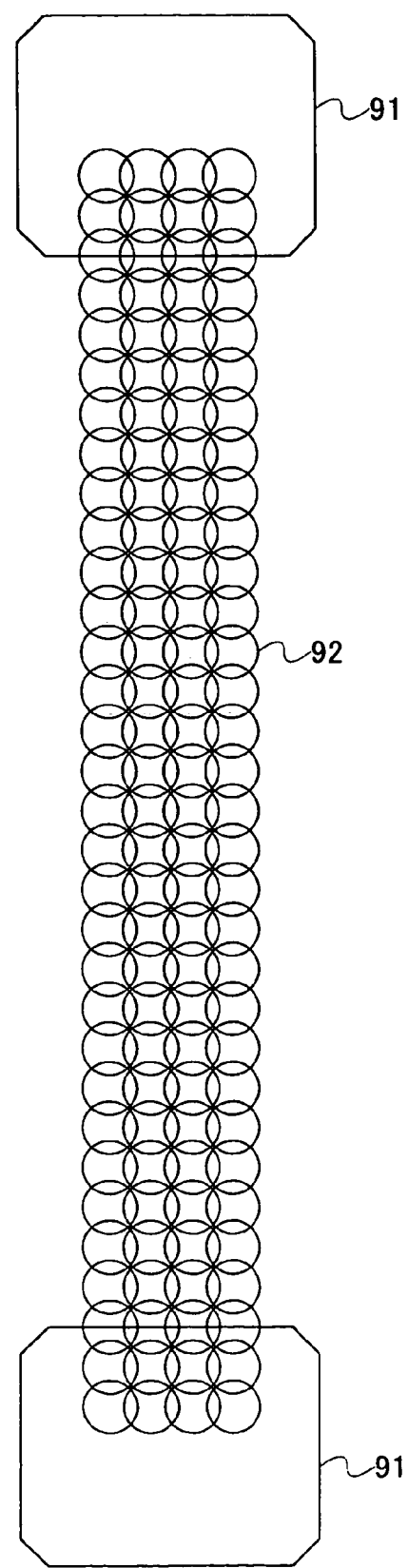
FIG. 17 is a drawing for explaining an example of moderating an abnormal electric discharge at a corner portion of the example shown in FIG. 15.
Figure 18:
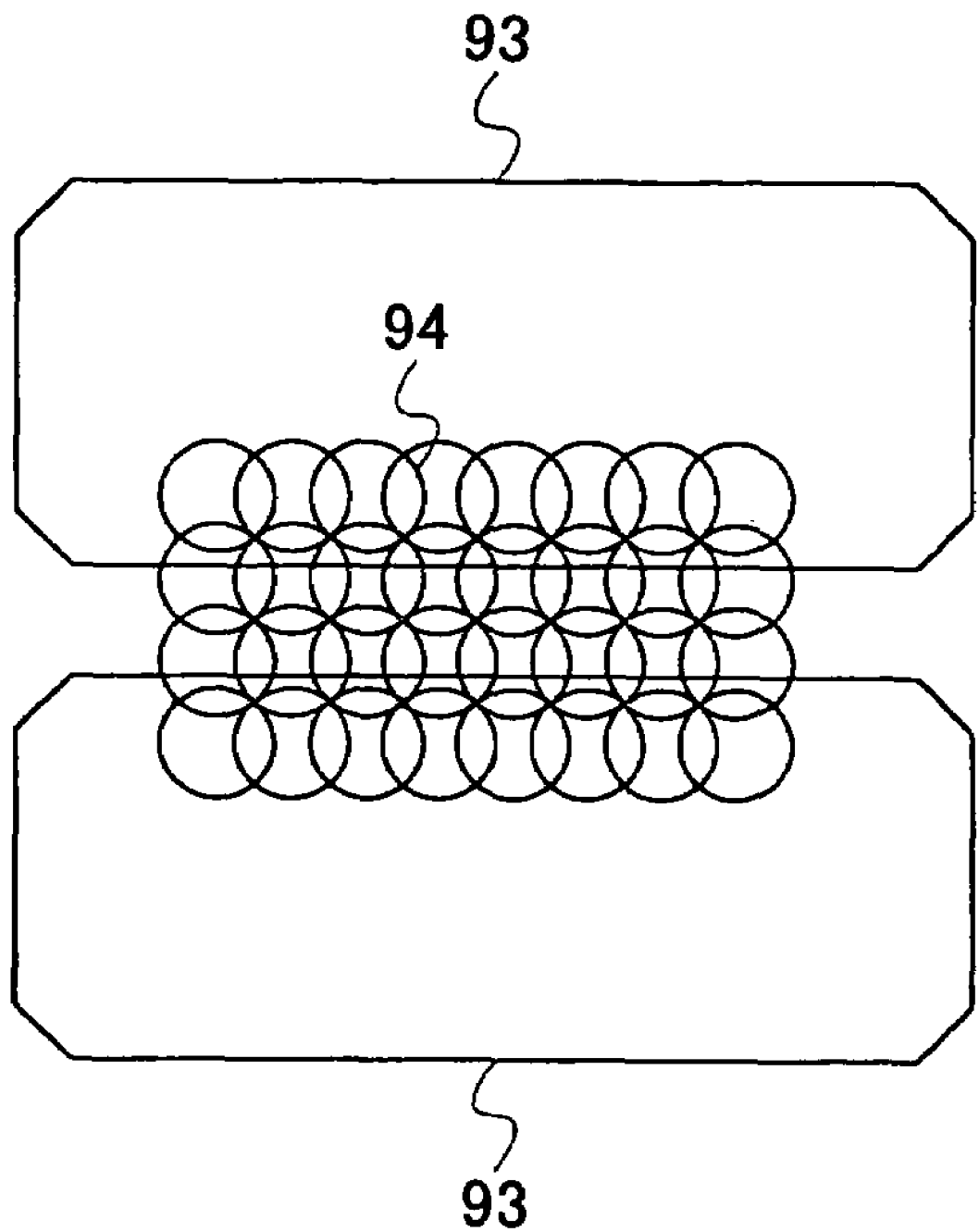
FIG. 18 is a drawing for explaining an example of moderating an abnormal electric discharge at a corner portion of the example shown in FIG. 16.

Taking this into consideration, an embodiment according to the present invention provides electrodes patterns 91, 93 having its corner portion formed with a chamfered shape (e.g. FIGS. 17 and 18). In this example, although the corner portions are chamfered by specifying the degrees c_in mechanical drawings; however, the chamfer may be defined by specifying the radius of curvature RXX in mechanical drawings.

The foregoing shape can be obtained by suitably using the photo mask so that the pointed corner portion will not be formed when applying the photolithography technique to form the electrode patterns 91, 93.

Typically, the size of the chamfered portions is approximately ½ to ⅕ of the diameter of a dot pattern. That is, if the size is c2 μm to c5 μm or r2 μm to r5 μm, a satisfactory electrode pattern can be obtained without generation of a concentrated electric field.

Accordingly, by removing pointed portions of the electrode patterns and eliminating concentration of electric field, the wiring patterns or various devices can be used with no abnormal electric discharge and with a stable and long lasting quality.

Figure 19:
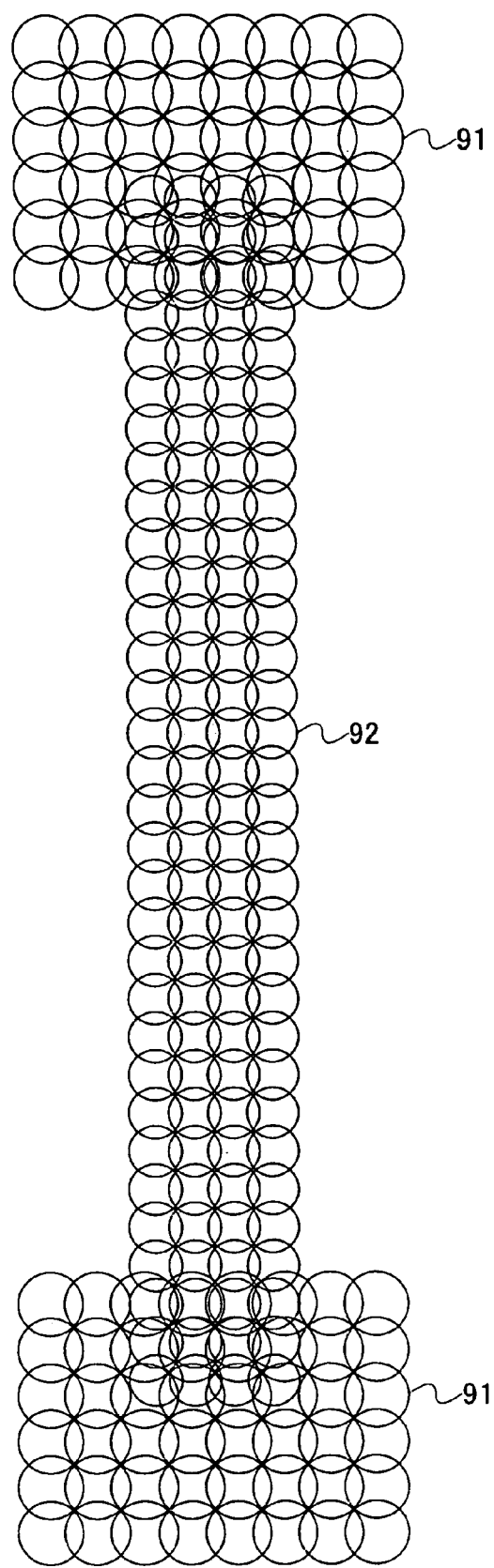
FIG. 19 is a drawing for explaining another example of moderating an abnormal electric discharge at a corner portion of the example shown in FIG. 15.
Figure 20:
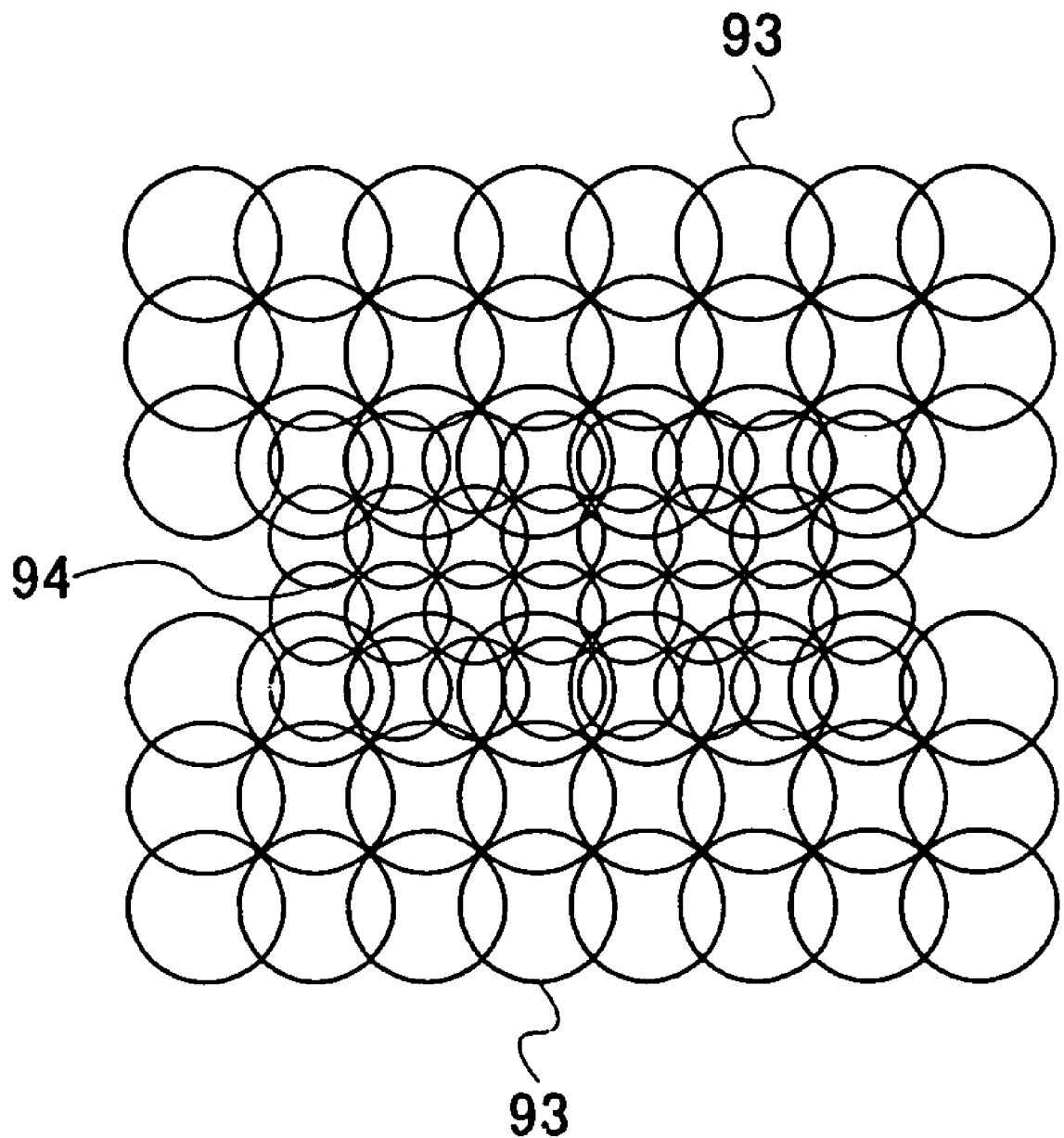
FIG. 20 is a drawing for explaining another example of moderating an abnormal electric discharge at a corner portion of the example shown in FIG. 16.

Next, another feature according to the present invention is described. The wiring patterns or electronic devices shown in FIGS. 19 and 20 are similar to those shown in FIGS. 15 through 18. In the examples shown in FIGS. 15 and 18, the electrode patterns (terminal patterns 91, device electrode patterns 93) are formed into desired shapes by conducting, for example, a photolithography technique, an etching technique upon a thin film (e.g. Al, Au, Cu) formed on a substrate beforehand. However, in the examples shown in FIGS. 19 and 20, the electrode patterns 91, 93 are formed by applying the solution jetting technique according to the present invention.

That is, in the same manner as the formation of wiring patterns and device patterns, a solution containing a conductive fine particle material (e.g. Ag) is employed to form the electrode patterns 91, 93 as a combination of dots. This has the advantages of being able to use the fabrication apparatus of the present invention (described with FIGS. 2 through 4B), and being able to solve the problem of abnormal electric discharge. As shown in FIGS. 19 and 20, a chamfered shape can automatically be obtained by forming the electrode patterns 91, 93 with dot patterns formed from jetting the solution having metal fine particles dispersed therein owing that the outer shape of the dot patterns is shaped round without any pointed portions.

Although the dot diameter of the electrode patterns 91, 93 are illustrated larger than those of the wiring patterns 92 or the device patterns (dot patterns) 94 in FIGS. 19 and 20, the dot patterns may be formed with the same size by using a same jet head with same nozzle size.

Meanwhile, the wiring pattern 92 formed of a combination of dots (shown in FIG. 15) is formed as strip-shaped pattern extending in a longitudinal direction, and the device (shown in FIG. 16) is also formed with the dot pattern 94 having a strip-shaped pattern. By setting the extending direction of the strip-shaped pattern in parallel to the X direction or Y direction described with FIGS. 2 through 4B, that is, in parallel to the direction of the relative movement of the substrate 14 and the jet head 11 (traveling direction of the carriage 12 mounting the jet head 11, or the traveling direction of the substrate 14), pattern information for controlling the ejection of the solution or control of the ejection can be simplified. Thereby, reducing cost for the formation of high precision patterns.

By setting the extending direction of the patterns in parallel to respective sides of a targeted rectangular substrate or parallel to matrix array of a targeted group of devices, determination of position and/or formation of patterns can be conducted with high precision.

Next, another example of solving the aforementioned problems as abnormal electric discharge is described.

Figure 21:
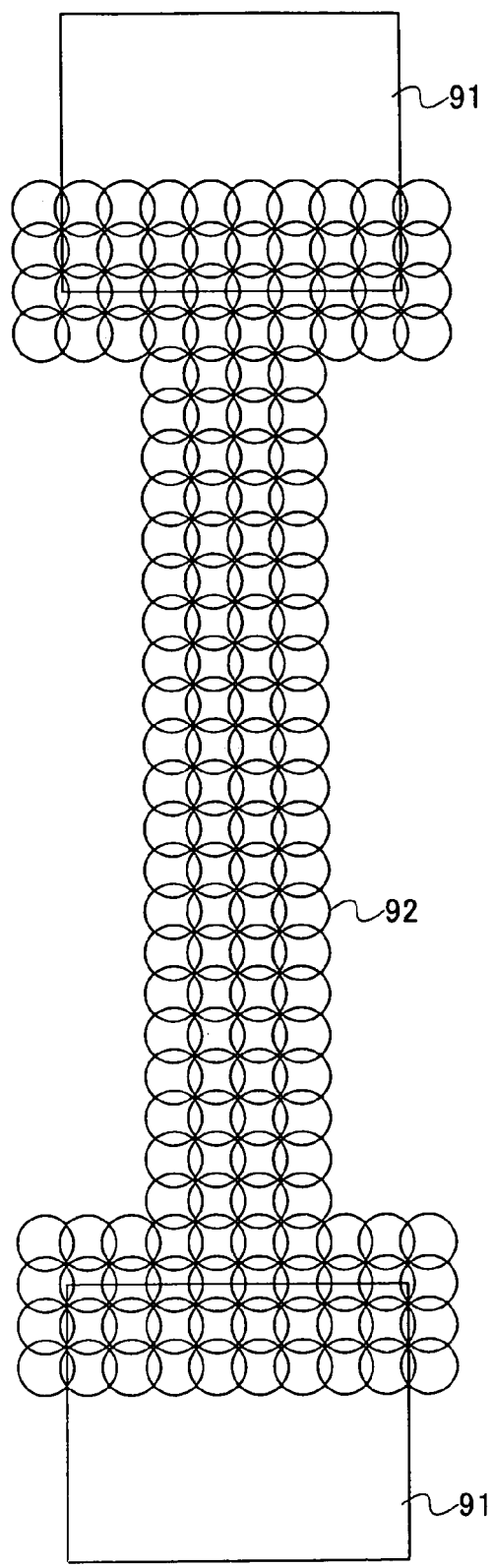
FIG. 21 is a drawing for explaining an example of moderating an abnormal electric discharge by covering a corner portion of the example shown in FIG. 15.
Figure 22:
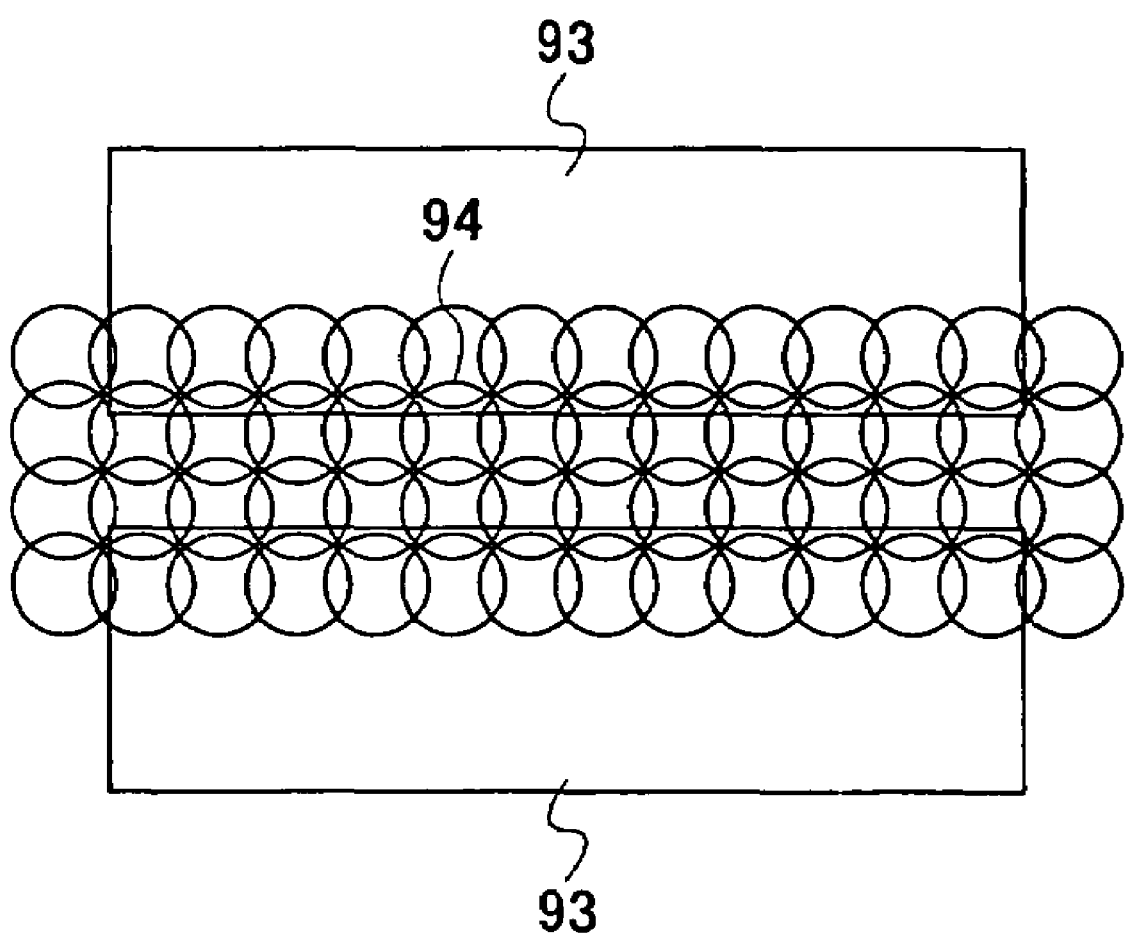
FIG. 22 is a drawing for explaining an example of moderating an abnormal electric discharge by covering a corner portion of the example shown in FIG. 16.
Figure 23:
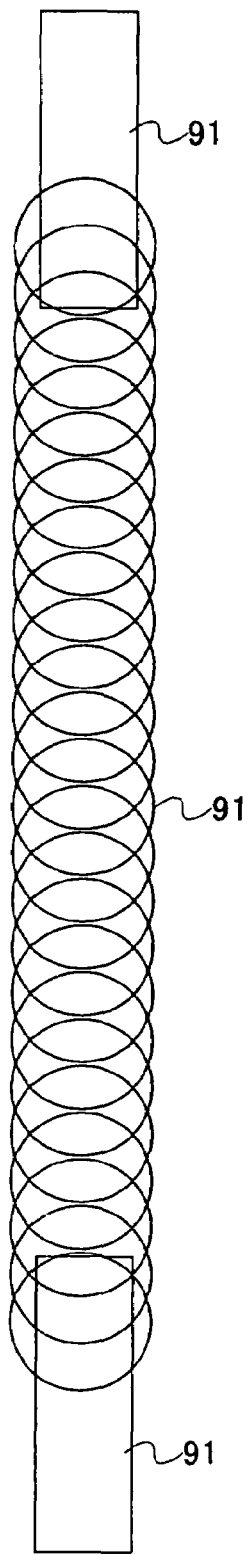
FIG. 23 is a drawing for explaining another example of moderating an abnormal electric discharge.
Figure 24:
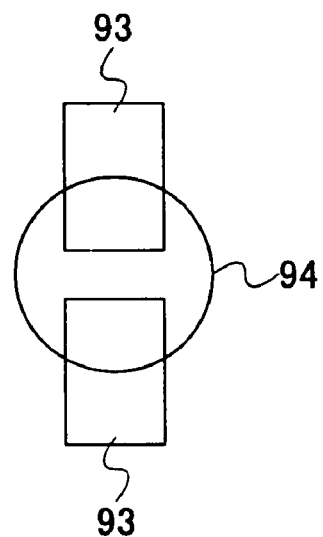
FIG. 24 is a drawing for explaining another example of moderating an abnormal electric discharge.

As shown in FIGS. 21 and 22, the wiring pattern 92 or the dot pattern 94 forming a device pattern are formed in a manner covering the corner portions of the electrode patterns 91, 93 so as to prevent exposure of the corner portions. Although the example of the wiring pattern 92 shown in FIG. 21 is illustrated as a 4 row dot pattern, the wiring pattern 92 may be formed as a single row dot pattern. Further, the device shown in FIG. 22 may be formed with a single dot as shown in FIG. 24.

In short, by covering the pointed portions of the electrode patterns 91, 93 with the dot patterns and not exposing the portions to the surface, abnormal electric discharge caused by concentrated electric field can be prevented, and the wiring patterns or various devices can be used with a stable and long lasting quality.

Figure 25:
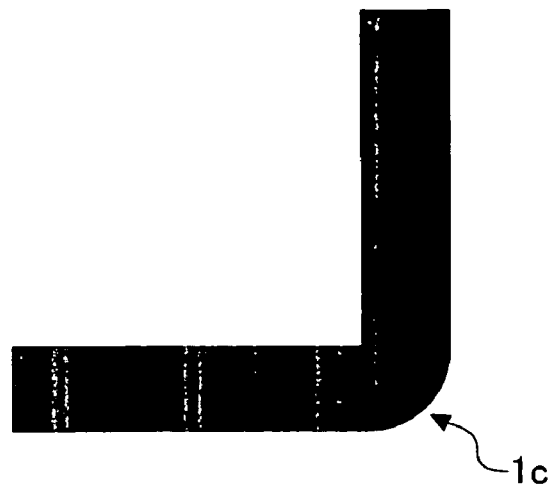
FIG. 25 is an enlarged view of a portion (corner portion) of the wiring pattern shown in FIG. 1B.

Next, another feature of the present invention is described. FIG. 25 is an enlarged view of an example of a portion (corner portion) of a wiring pattern 1 shown in FIG. 1B. In relation to the aforementioned problems such as concentration of electric field, the wiring pattern 1 is provided in a manner that a corner portion (outer area at which the pattern bends in a right angle) 1C is not pointed.

Figure 26:
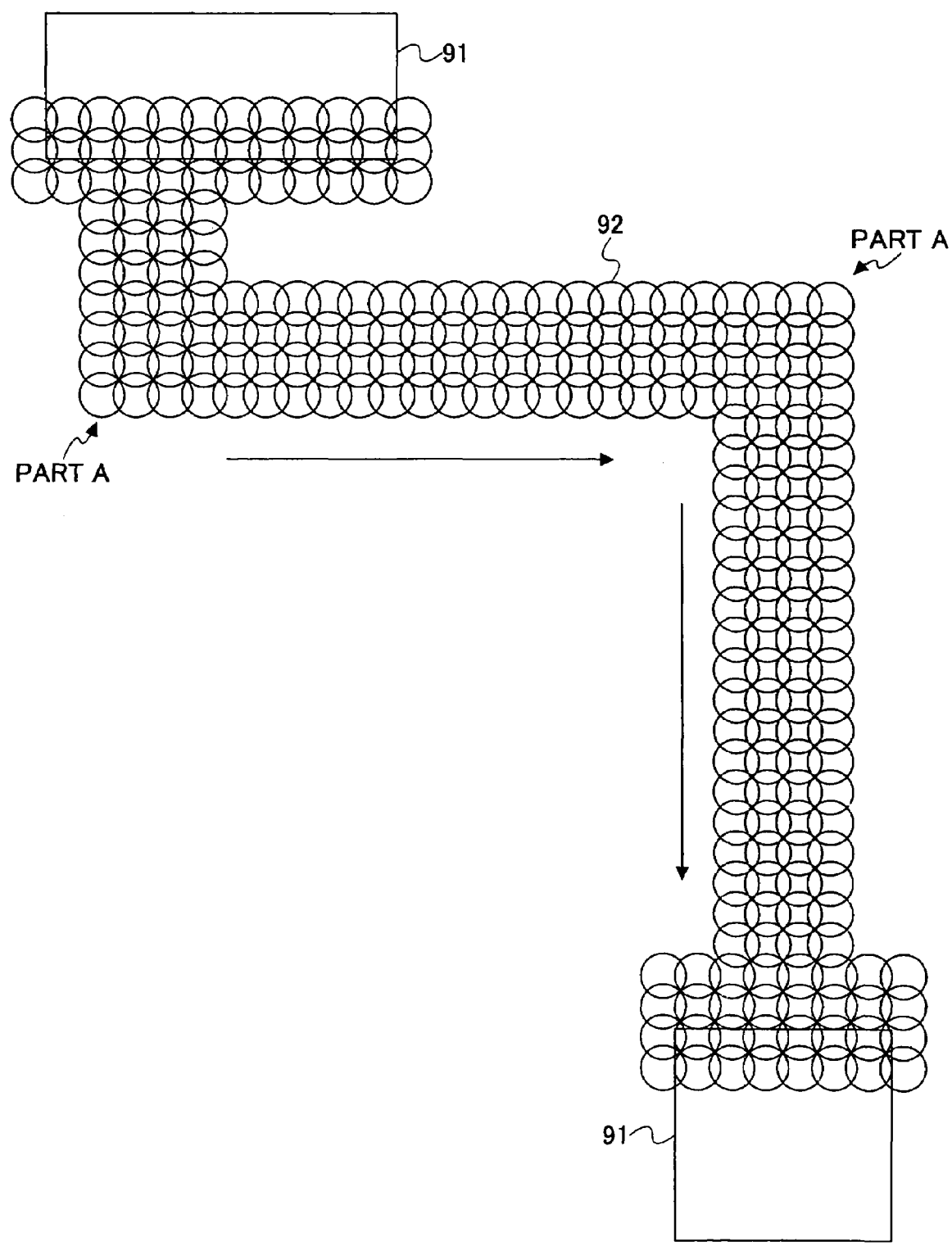
FIG. 26 is a view for explaining an example of a wiring pattern of a wiring pattern substrate formed by a principle (technique) according to the present invention.

The example is described in more detail with reference to FIGS. 26 through 29. FIG. 26 shows one example of a wiring pattern formed on a wiring pattern substrate by using the jet technique (principle) according to the present invention. In this example, dot patterns are combined in a manner where the wiring pattern 92 is bent 90 degrees (right angle) in midstream. That is, the wiring pattern 92 is form as a strip-like pattern extending in parallel to the two perpendicular directions (as indicated with arrows), and is bent according to the circumstance of the arrangement of the wiring pattern 92. In this case, as shown in part A of FIG. 26, the outer area of the bending portion of the wiring pattern 92 is formed as a curve. By forming dot patterns in such manner, the bent corner portion of the wiring pattern 92 will not be pointed, and concentration of electric field can be prevented.

Figure 27:
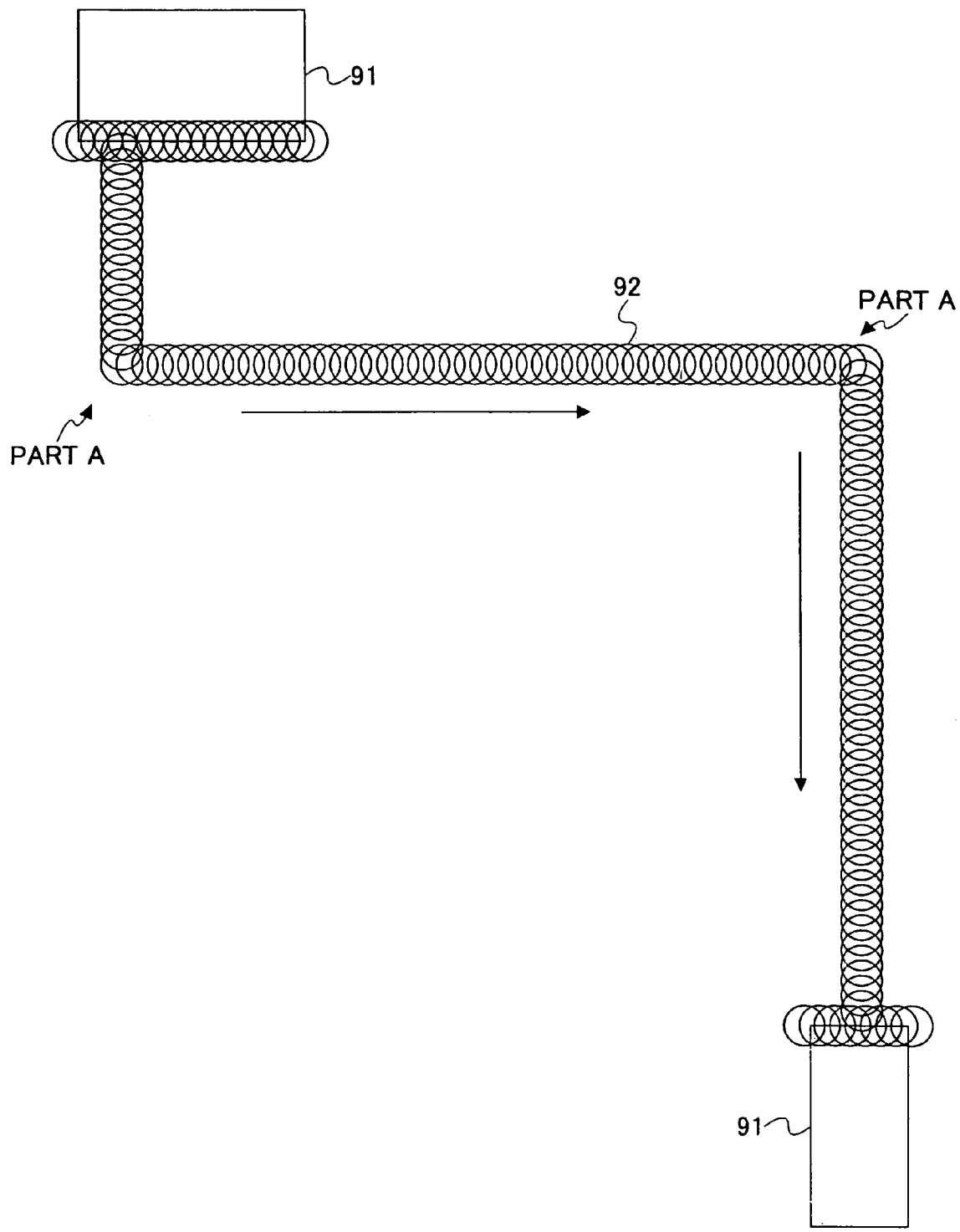
FIG. 27 is a view for explaining another example of a wiring pattern of a wiring pattern substrate formed by a principle (technique) according to the present invention.

FIG. 27 shows one example of the wiring pattern 92 formed in a manner having a dot pattern formed in a single row. In this case also, the bent corner portion of the wiring pattern 92 (part A in FIG. 27) will not be pointed, and concentration of electric field can be prevented.

Figure 28:
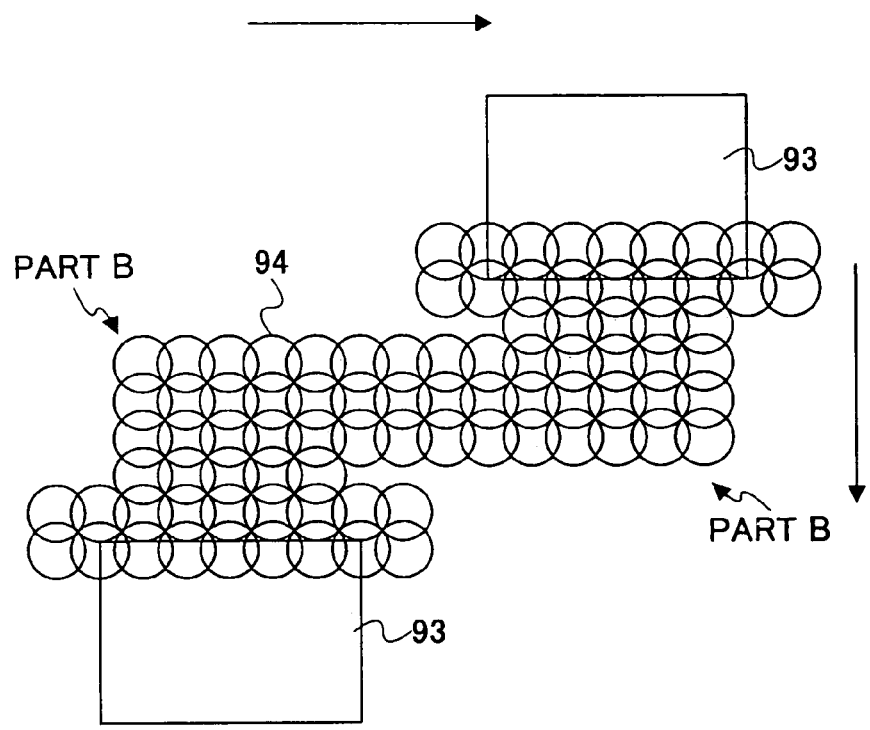
FIG. 28 is a view for explaining an example of a device of a device substrate formed by a principle (technique) according to the present invention.

FIG. 28 shows one example of a device formed on a device substrate by using the jet technique (principle) according to the present invention. In this example, a device is formed by jetting a solution containing fine particles to a pair of device electrodes (electrode patterns) 93 which are formed on a substrate beforehand in the shapes of rectangles or a combination of rectangles. In this case also, the dot pattern 94 (device pattern portion) is formed as a strip-shape pattern, and the strip-shape pattern is bent 90 degrees in midstream, so as to obtain a desired device shape. As shown in part B of FIG. 28, by forming dot patterns in such manner, the bending corner portion can be formed without being pointed. Thereby, concentration of electric field can be prevented.

Figure 29:
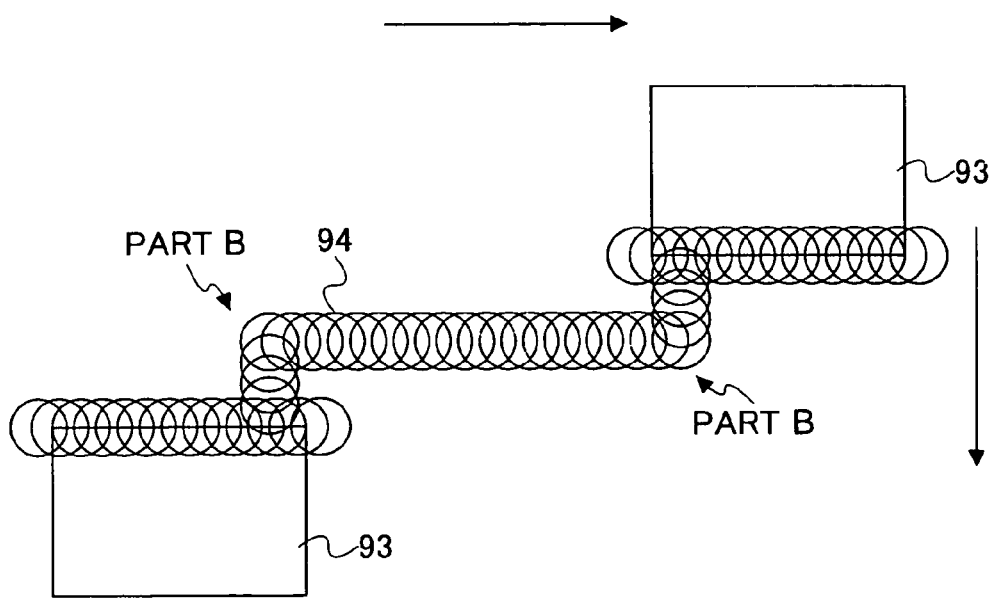
FIG. 29 is a view for explaining another example of a device of a device substrate formed by a principle (technique) according to the present invention.

FIG. 29 shows a device pattern is formed in a manner having a dot pattern 94 formed in a single row. In this case also, the bent corner portion of the dot pattern 94 (part B in FIG. 29) will not be pointed, and concentration of electric field can be prevented.

Meanwhile, the wiring pattern 92 formed of a combination of dots (shown in FIGS. 15, 21, 23, 26, 27) is formed as strip-shaped pattern extending in a longitudinal direction, and the device (shown in FIGS. 16, 22, 28, 29) is also formed with the dot pattern 94 having a strip-shaped pattern. By setting the extending direction of the strip-shaped pattern in parallel to the X direction or Y direction described with FIGS. 2 through 4B, that is, in parallel to the direction of the relative movement of the substrate 14 and the jet head 11 (traveling direction of the carriage 12 mounting the jet head 11, or the traveling direction of the substrate 14), pattern information for controlling the ejection of the solution or control of the ejection can be simplified. Thereby, reducing cost for the formation of high precision patterns.

By setting the extending direction of the patterns in parallel to respective sides of a targeted rectangular substrate or parallel to matrix array of a targeted group of devices, determination of position and/or formation of patterns can be conducted with high precision.

Another feature of the present invention will be further described. The functional device to be manufactured according to the present invention is manufactured by jetting in the air the solution containing the fine particle material, in which an infinite number of minute metal fine particles and nano particles are dispersed, in accordance with the ink-jet principle, and by providing the droplet on the substrate. In order to manufacture the functional device at a high precision and a high grade, it is required to jet and provide the solution containing the fine particle material on the substrate, and to optimize a roughness of a substrate surface where a minute dot pattern is formed and the size of the nanoparticle.

Particularly, in contrast to paper which is able to absorb ink, the present invention is not applied to a substrate having a liquid absorbing property. Therefore, although the present invention uses inkjet technique (inkjet principle) to apply a solution containing fine particles, the concept for an inkjet recording apparatus does not apply in the same manner as for apparatus of the present invention.

According to an embodiment of the present invention, the ejected solution containing fine particles is left in a meniscus-like manner on a substrate. Then, after a prescribed period, the liquid part of the solution is evaporated and dried, thereby leaving the solid part of the solution remaining on the substrate. In this case, the principle of adhering ink to paper does not exactly apply in forming satisfactory dot patterns since the substrate of the present invention has no liquid absorbing property (in contrast to an inkjet paper with fibers).

Taking this into consideration, the roughness of the substrate surface for achieving satisfactory pattern formation has been examined.

Figure 30:
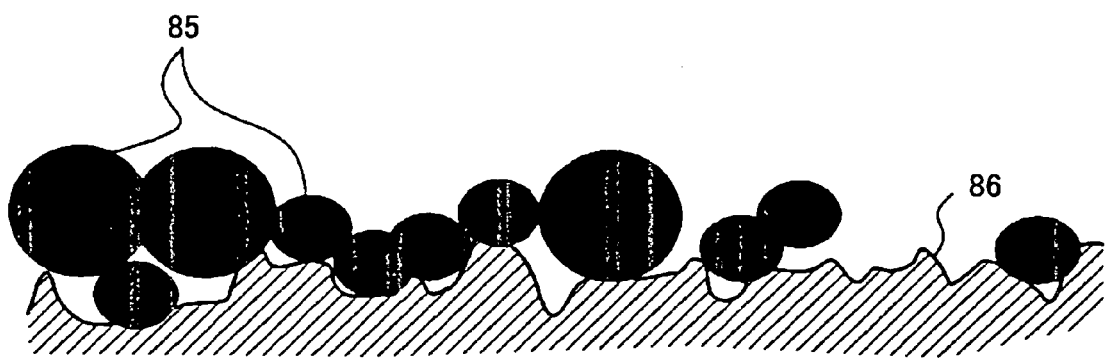
FIG. 30 is a schematic view showing a relation between fine particles and surface roughness in a case where dot patterns are formed by a solution containing fine particles that are larger than the surface roughness of a substrate.

For example, the roughness of the substrate surface is concavity and convexity of the substrate surface. As shown in FIG. 30, if a particle 85 larger than the concavity and convexity of a surface 86 of the substrate adheres on the surface 86 of the substrate, the proper dot pattern cannot be obtained. As shown in FIG. 31, if a particle 85 smaller than the concavity and convexity of a surface 86 of the substrate adheres on the surface 86 of the substrate, the proper dot pattern can be obtained. Considering this point in the present invention, a pattern (dot pattern) was formed on the substrate which roughness of the surface was known beforehand, by each of the solutions including fine particles of different sizes. After the pattern is formed, the pattern was evaluated.

In one experiment, a pyrex™ glass was polished so as to be from 0.01 s to 0.02 s in roughness of the surface. The solution containing the Ag fine particles (in this case, the diameter of the fine particle being from 0.0005 μm to 0.2 μm was used) was combined to and jet from the liquid jet head H4 (nozzle diameter Φ5 μm). Then, a pattern chaining dots was formed. Smoothness of the pattern was observed by using the microscope, a sensory evaluation was conducted, and then it was determined whether the pattern was excellent "o", good "Δ", or defect "x".

Details of this examination are described below. The pattern is formed in a single row, in which approximately 100 dots (dot size of approximately Φ8 μm) were embedded in a pitch of approximately 4 μm.

The jet head H4 used in the experiment has 64 nozzles with an alignment density of 100 dpi. The jet head and the substrate were relatively moved (in this experiment, the substrate was fixed and the jet head was scanned with the carriage), in which the relative movement was controlled by a μ order. Further, the jet timing was also controlled. Thereby, conducting pattern formation of dots with a pitch of approximately 4 μm.

The jet head used is a jet head utilizing piezo elements, wherein the input voltage to the piezo element was 15 V. The drive frequency was given as 10 kHz. The mass of the jet droplet was always substantially constant (in this case, 1 pl). Further, a fluid droplet was separately ejected under the same conditions as the actual device formation, and the shape of the droplet during the flight was observed. Then, a droplet was ejected while controlling the drive waveform so that the droplet became substantially round, as shown in FIG. 12, immediately before the droplet reached the substrate surface (in this example, after 3 mm flight). Even if a perfectly round sphere cannot be obtained, and instead, an elongated droplet extending along the path of flight is obtained as shown in FIG. 13, the length of the elongated droplet can be easily set, for example, equal to or smaller than three times the diameter ($1 \leq 3$ d) simply by controlling the driving waveform. That is, the length of the elongated droplet in the ejecting direction may be set, for example, no more than three times the length of the elongated droplet in a direction perpendicular to the ejecting direction. The drive conditions (including the drive waveform) were chosen so that there were no minute droplets 81 trailing behind the flying droplet.

As described above, solutions including the Ag fine particles having a different diameter in a range from 0.0005 μm to 0.2 μm were prepared and used (a solution No. is common with those previously described tables). In a case in that the diameter of the fine particle was no less than 0.02 μm, the nozzle started to be clogged. Accordingly, only the patterns, which were not clogged and were properly formed, were selected from all patterns formed on the substrate, and were evaluated. A result of this experiment will be shown as follows:

TABLE 7

| Solution No. | Diameter of Ag fine particle Dp (mm) | Determination |
|---|---|---|
| 3 | 0.0005 | ◯ |
| 4 | 0.001 | ◯ |
| 5 | 0.002 | ◯ |
| 6 | 0.004 | ◯ |
| 7 | 0.006 | ◯ |
| 8 | 0.01 | ◯ |
| 9 | 0.02 | Δ |
| 10 | 0.05 | X |
| 11 | 0.07 | X |
| 12 | 0.1 | X |
| 13 | 0.15 | X |
| 14 | 0.2 | X |

In another experiment, a pyrex™ glass was polished so as to be from 0.01 s to 0.02 s in roughness of the surface. The solution containing the Ag fine particles (in this case, the diameter of the fine particle being from 0.0005 μm to 0.2 μm was used) was combined to and jet from the liquid jet head (such as the head shown in FIG. 7A through FIG. 7C) of the thermal jet method (bubble jet method) which instantaneously creates a droplet jetting force in the solution by using growth displacement force of a film boiling bubble. Then, a pattern chaining dots was formed. Smoothness of the pattern was observed by using the microscope, a sensory evaluation was conducted, and then it was determined whether the pattern was excellent "o", good "Δ", or defect "x".

Figure 7A:
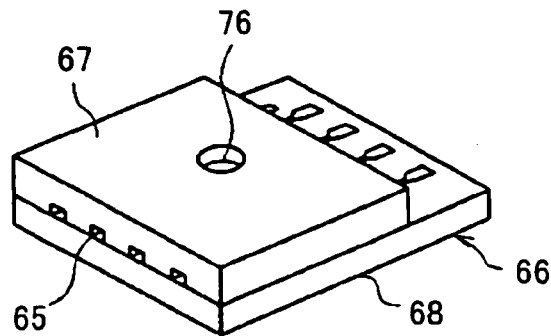
FIGS. 7A, 7B, 7C are drawings showing an example of a jet head of a thermal type (bubble type) for suitable use by the present invention.
Figure 7B:
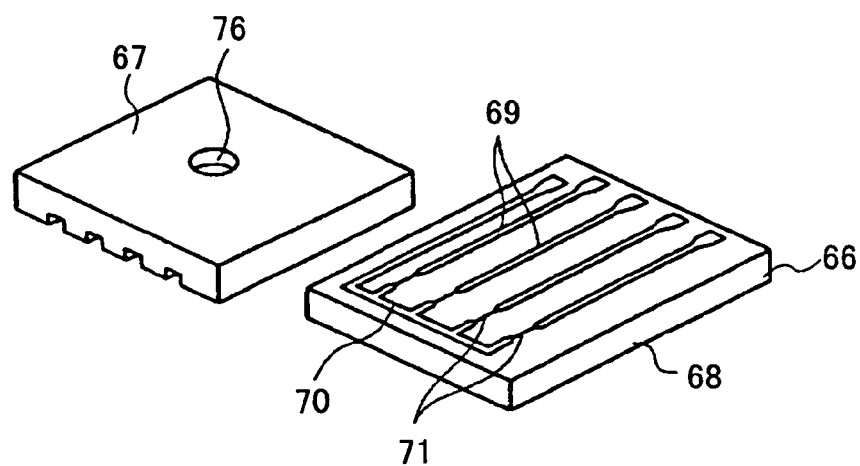
Figure 7C:
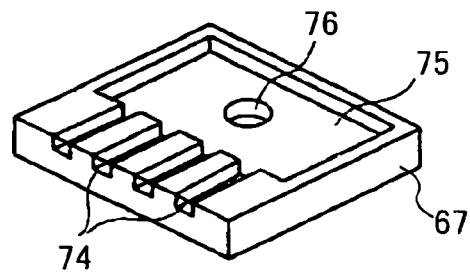

In this examination, a type of jet head which has the nozzle 65 serving as a flow path (as shown in FIG. 7A through FIG. 7C) was not applied but a jet head, to which a nozzle hole was additionally provided on a surface of the nozzle 65, was used. The nozzle was a round nozzle formed by the Ni electro-forming, the size of the nozzle was Φ5 μm, and the thickness of an opening part was 10 μm.

In addition, 64 nozzles were provided and the arrangement density was 400 dpi. The size of the heating element was 10 μm×40 μm, and the resistance value 100 Ω. The drive voltage of the head was 10 V, the pulse width was 2 μs, and the drive frequency 14 kHz. The quantity of one droplet was approximately 1 pl.

As shown in FIG. 11A through FIG. 11B, the pattern was formed to form one line (row) between the ITO transparent electrodes 82 formed at a 0.4 mm interval at an upside and a downside on pyrex™ glass, by jetting 4 dots being approximately Φ8 μm with a pitch of approximately 4 μm pitch.

In order to obtain the 4 μm pitch between the dots, the jet head and the substrate were relatively moved (in this experiment, the substrate was fixed and the jet head was scanned with the carriage), in which the relative movement was controlled by a μ order. Further, the jet timing was also controlled. Thereby, conducting pattern formation of dots with a pitch of approximately 4 μm, while maintaining the center-to-center distance of 12 μm. In addition, a similar pattern was formed adjacently to the pattern so as to connect the ITO transparent electrodes 82 and interval between the ITO transparent electrodes 82 in that a center-to-center distance was defined as 12 μm.

Under this experimental condition, the pattern above-described was formed on the glass substrate. After the pattern was formed, the pattern was evaluated. In addition, under the same experimental condition, another discharge experiment was conducted, and then a discharge state of the solution being 3 mm away from the discharge opening (nozzle) was observed. This owes to the fact that the pattern of the device shown in FIG. 11A and FIG. 11B was produced where a distance was set as 3 mm between the substrate and the discharge opening (nozzle). As shown in FIG. 14, the jet state was the droplet forming the pole shape (l=5 d to 20 d) considerably extended in the jet direction (flight direction). The jet state also showed the droplet accompanying with the plurality of minute droplets at the rear portion in the jet direction.

As described above, solutions including the Ag fine particles having a different diameter in a range from 0.0005 μm to 0.2 μm were prepared and used (a solution No. is common with those previously described tables). In a case in that the diameter of the fine particle was no less than 0.02 μm, the nozzle started to be clogged. Accordingly, only the patterns, which were not clogged and were properly formed, were selected from all patterns formed on the substrate, and were evaluated. A result of this experiment will be shown as follows:

TABLE 8

| Solution No. | Diameter of Ag fine particle Dp (mm) | Determination |
|---|---|---|
| 3 | 0.0005 | ◯ |
| 4 | 0.001 | ◯ |
| 5 | 0.002 | ◯ |
| 6 | 0.004 | ◯ |
| 7 | 0.006 | ◯ |
| 8 | 0.01 | ◯ |
| 9 | 0.02 | Δ |
| 10 | 0.05 | X |
| 11 | 0.07 | X |
| 12 | 0.1 | X |
| 13 | 0.15 | X |
| 14 | 0.2 | X |

According to the results shown in the tables 7 and 8, if the size of the fine particle included in the solution is smaller than the size of the roughness of the surface of the substrate where the pattern formed, the dot pattern can be formed smoothly and properly at a high precision. On the other hand, if the size of the fine particle is greater than the size of the roughness of the surface of the substrate, the smoothness of the dot pattern is impaired.

Next, another feature of the present invention is described below. The functional substrate according to the present invention is produced by jetting the solution having countless fine/nano particles dispersed therein in accordance with an inkjet technique (inkjet principle) and providing the droplet on a substrate. However, in order to stably form the substrate with a high grade function for a long term, the fabrication apparatus thereof should stably maintain a certain performance. The most important point is a long term performance stability of a jet head.

As described above, according to the present invention, the solution containing fine particles is a solution where the fine particles are dispersed in liquid. However, the fine particles are such as abrasive grains dispersed in the solution. In a case of using a large amount of this solution, a path the jet head for the solution is damaged and worn. In the path, especially, a scratch around a discharge opening part (nozzle part) and abrasion influence a droplet jet performance of the solution.

The scratch and abrasion are caused when two materials collide or scratched each other. Accordingly, these problems can be eliminated by properly selecting hardness of two materials. Moreover, it is true that the scratch influences the droplet jet performance. It is thought that this influence depends on a size of the scratch and a size of the path. For example, even if there is a scratch of a nanometer order in a hose having Φ15 mm-Φ20 m inside diameter for jetting the droplet, this scratch cannot greatly influence a discharging flow.

In the embodiment of the present invention, hardness of the material of the discharge opening part (nozzle part), hardness of the material of the fine particles, and the size of the discharge opening part (nozzle part) were carefully considered.

In one examination, jet heads same as the aforementioned jet heads H1 through H3 were used. That is, jet heads using piezo elements 46 as a force for jetting liquid droplets, as shown in FIGS. 5 and 6. That is, jet heads in which the mechanical change of the piezo elements, being a change in the vibration plate of a liquid chamber, generates a force of jetting liquid droplets from the fine discharge opening (nozzle).

Although not shown in the drawings, the jet heads used in this examination are mounted with a nozzle plate having discharge openings (nozzles) provided on a nozzle plane thereof. In the experiment, the jet head having 64 discharge openings (nozzles) was used and an arrangement density of these discharge openings (nozzles) was 100 dpi.

By using the jet heads, the solution had been jetted for a certain period, and then it was checked whether a scratch was caused at the discharge opening part (nozzle part) and it was checked whether a formed device shape (shape quality of a dot pattern) and a device performance was influenced by deterioration of a performance of discharging a droplet of the solution. Various materials and various nozzle diameters (a round shape was applied in this case) were prepared as the multi nozzle plate. The pattern performance was checked by comparing a resistance value of a pattern formed in a beginning of the discharge with that of a pattern formed after discharge was continued for a prescribed period.

With the jet heads, the drive voltage of the jet heads were 20V, and the drive frequency was 10 kHz. Under these conditions, jet was conducted for 100 consecutive hours. An SEM observation was conducted with respect to the discharge opening part (nozzle part) after the 100 hour consecutive jet was ended. Then, it was checked whether or not a scratch is caused. Φ20 μm, Φ15 μm, and Φ10 μm nozzle diameters were prepared for jet head H1, jet head H2, and jet head H3, respectively. A Φ36 μm nozzle diameter was prepared to be compared for a reference head. In this case, the jet head included 48 discharge openings (nozzles) and the arrangement density was 60 dpi. The drive voltage of the jet head was 30 V, the drive frequency was 3.8 kHz, and jet was conducted for 260 consecutive hours.

The thickness of the nozzle plate of the jet heads H1 and H2 were 30 μm, the thickness of the nozzle plate of jet head H3 was 20 μm, and the reference head was 40 μm. Droplet speeds of the jet heads H1, H2, and H3 were approximately 7 m/s.

A nozzle plate material was Ni and austenitic stainless SUS304. The multi nozzle plate was produced from a Ni material by an electro-forming method. The multi nozzle plate was produced from an SUS304 material by trephining nozzle openings by conducting an electrondischarge method with respect to a stainless plate. Each hardness degree was measured by a Vickers sclerometer. In a case of the Ni material, the Vickers sclerometer Hv was 58 through 63. In a case of the SUS304 material, the Vickers sclerometer Hv was 170 through 190.

Liquid used in this experiment is an aqueous solution which is a dispersion medium mainly composed of water having fine particles dispersed therein. The fine particles are shown as S1 through S7 in table 9. In the table 9, an element name of an included fine particle and the Vickers hardness degree Hv in a bulk state. As the Vickers hardness degree, values shown in a metal data book (Nippon Kinzoku Gakkai, version No. 3, Maruzen) are shown in the table 9. A particle content in each solution was 8%, and a particle diameter was from 0.01 μm to 0.02 μm.

TABLE 9

| Sample Number | Included Particle | Vickers Hardness Degree Hv |
|---|---|---|
| S1 | Pd | 38 |
| S2 | Pt | 39 |
| S3 | Ru | 350 |
| S4 | Ag | 26 |
| S5 | Zn | 45 |
| S6 | W | 360 |
| S7 | Pb | 37 |

Evaluation results of using these sample solutions and jet heads, and the reference head will be shown below. In the tables below, "o" of a scratch item indicates that no obvious scratch was found after the 100 hour consecutive jet and "x" of the scratch item indicates that a plurality of scratches that influence the nozzle shape or the nozzle size were found after the 100 hour consecutive jet. "o" of a device shape indicates that the dot pattern was formed at a proper round shape (FIG. 11A) at a target location (between a pair of electrodes) when the device is produced after the 100 hour consecutive jet and "x" of the device shape indicates that the dot pattern was not form at the proper round shape, the dot pattern was not formed at the target location (that is, the dot pattern was formed at a location slightly displacing from the target location), or minute drops were scattered around the target location (FIG. 11B) after the 100 hour consecutive jet. "o" and "x" of a pattern performance indicate "o (good)" and "x (bad)" of a difference between a resistance value of a pattern formed in the beginning of the jet and that of a pattern formed after jet of a prescribed period, in which "o" indicates that the resistance value of the pattern formed after 100 consecutive hours is more or less the same as that of the pattern formed in the beginning of the jet (practical level), and "x" indicates that the resistance value of the pattern formed after 100 consecutive hours is unusually higher or lower than that of the pattern formed in the beginning of the jet (impractical level). It is to be noted that jet was conducted for the reference head for 260 hours. The results are shown below.

TABLE 10

Case of Φ20 μm nozzle diameter

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | ○ | ○ | ○ | ○ | ○ | ○ |
| S2 | ○ | ○ | ○ | ○ | ○ | ○ |
| S3 | X | X | X | X | X | X |
| S4 | ○ | ○ | ○ | ○ | ○ | ○ |
| S5 | ○ | ○ | ○ | ○ | ○ | ○ |
| S6 | X | X | X | X | X | X |
| S7 | ○ | ○ | ○ | ○ | ○ | ○ |

TABLE 11

Case of Φ15 μm nozzle diameter

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | ○ | ○ | ○ | ○ | ○ | ○ |
| S2 | ○ | ○ | ○ | ○ | ○ | ○ |
| S3 | X | X | X | X | X | X |
| S4 | ○ | ○ | ○ | ○ | ○ | ○ |
| S5 | ○ | ○ | ○ | ○ | ○ | ○ |
| S6 | X | X | X | X | X | X |
| S7 | ○ | ○ | ○ | ○ | ○ | ○ |

TABLE 12

Case of Φ10 μm nozzle diameter

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | ○ | ○ | ○ | ○ | ○ | ○ |
| S2 | ○ | ○ | ○ | ○ | ○ | ○ |
| S3 | X | X | X | X | X | X |
| S4 | ○ | ○ | ○ | ○ | ○ | ○ |
| S5 | ○ | ○ | ○ | ○ | ○ | ○ |
| S6 | X | X | X | X | X | X |
| S7 | ○ | ○ | ○ | ○ | ○ | ○ |

TABLE 13

Case of Φ36 μm nozzle diameter (reference head)

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | ○ | ○ | ○ | ○ | ○ | ○ |
| S2 | ○ | ○ | ○ | ○ | ○ | ○ |
| S3 | X | ○ | ○ | X | ○ | ○ |
| S4 | ○ | ○ | ○ | ○ | ○ | ○ |
| S5 | ○ | ○ | ○ | ○ | ○ | ○ |
| S6 | X | ○ | ○ | X | ○ | ○ |
| S7 | ○ | ○ | ○ | ○ | ○ | ○ |

In another examination, jet heads of a thermal liquid jet type (bubble type) as shown in FIGS. 7A through 7C, in which a droplet is jet by using instantaneous growth displacement force of a film boiling bubble in a solution, were used.

In this examination, a type of jet head which has the nozzle 65 serving as a flow path (as shown in FIG. 7A through FIG. 7C) was not applied but a jet head, to which a nozzle hole was additionally provided on a surface of the nozzle 65, was used. Further, the jet heads each had 64 round discharge openings (nozzles) and an arrangement density of these discharge openings (nozzles) was 400 dpi.

By using the jet heads, the solution had been jetted for a certain period, and then it was checked whether a scratch was caused at the discharge opening part (nozzle part) and it was checked whether a formed device shape (shape quality of a dot pattern) and a device performance was influenced by deterioration of a performance of discharging a droplet of the solution. The pattern that was used is shown as FIG. 11A. Various materials and various nozzle diameters (a round shape was applied in this case) were prepared as the multi nozzle plate. The pattern performance was checked by comparing a resistance value of a pattern formed in a beginning of the discharge with that of a pattern formed after discharge was continued for a prescribed period.

The size of the heating element was 10 μm×40 μm, and the resistance value 101 Ω. The drive voltage of the head was 10 V, the pulse width was 2 μs, and the drive frequency 14 kHz. Under these conditions, jet was conducted for 70 consecutive hours. An SEM observation was conducted with respect to the discharge opening part (nozzle part) after the 70 hour consecutive jet was ended. Then, it was checked whether or not a scratch is caused. Φ20 μm, Φ15 μm, and Φ10 μm nozzle diameters were prepared. A Φ36 μm nozzle diameter was prepared to be compared for a reference head. In this case, the jet head included 48 discharge openings (nozzles) and the arrangement density was 180 dpi. The size of the heating element was 35 μm×180 μm, the resistance value was 125 Ω, the drive voltage of the jet head was 28 V, and the drive frequency was 3.5 kHz. The jet was conducted for 280 consecutive hours.

The thickness of the nozzle plate of the jet heads with Φ20 μm and Φ15 μm nozzle diameters were 30 μm, the thickness of the nozzle plate of jet head with Φ10 μm nozzle diameter was 20 μm, and the reference head with Φ36 μm nozzle diameter was 40 μm. Droplet speeds of all of the foregoing jet heads were approximately 11 m/s.

A nozzle plate material was Ni and austenitic stainless SUS304. The multi nozzle plate was produced from a Ni material by an electro-forming method. The multi nozzle plate was produced from an SUS304 material by trephining nozzle openings by conducting an electrondischarge method with respect to a stainless plate. Each hardness degree was measured by a Vickers sclerometer. In a case of the Ni material, the Vickers sclerometer Hv was 58 through 63. In a case of the SUS304 material, the Vickers sclerometer Hv was 170 through 190.

Liquid used in this experiment is an aqueous solution which is a dispersion medium mainly composed of water having fine particles dispersed therein. The fine particles are shown as S1 through S7 in table 14. In the table 14, an element name of an included fine particle and the Vickers hardness degree Hv in a bulk state. As the Vickers hardness degree, values shown in a metal data book (Nippon Kinzoku Gakkai, version No.3, Maruzen) are shown in the table 14. A particle content in each solution was 8%, and a particle diameter was from 0.01 μm to 0.02 μm.

TABLE 14

| Sample Number | Included Particle | Vickers Hardness Degree Hv |
|---|---|---|
| S1 | Pd | 38 |
| S2 | Pt | 39 |
| S3 | Ru | 350 |
| S4 | Ag | 26 |
| S5 | Zn | 45 |
| S6 | W | 360 |
| S7 | Pb | 37 |

Evaluation results of using these sample solutions and jet heads, and the reference head will be shown below. In the tables below, "o" of a scratch item indicates that no obvious scratch was found after the 70 hour consecutive jet and "x" of the scratch item indicates that a plurality of scratches that influence the nozzle shape or the nozzle size were found after the 70 hour consecutive jet. "o" of a device shape indicates that the dot pattern was formed at a proper round shape (FIG. 11A) at a target location (between a pair of electrodes) when the device is produced after the 70 hour consecutive jet and "x" of the device shape indicates that the dot pattern was not form at the proper round shape, the dot pattern was not formed at the target location (that is, the dot pattern was formed at a location slightly displacing from the target location), or minute drops were scattered around the target location (FIG. 11B) after the 70 hour consecutive jet. "o" and "x" of a pattern performance indicate "o (good)" and "x (bad)" of a difference between a resistance value of a pattern formed in the beginning of the jet and that of a pattern formed after jet of a prescribed period, in which "o" indicates that the resistance value of the pattern formed after 70 consecutive hours is more or less the same as that of the pattern formed in the beginning of the jet (practical level), and "x" indicates that the resistance value of the pattern formed after 70 consecutive hours is unusually higher or lower than that of the pattern formed in the beginning of the jet (impractical level). It is to be noted that jet was conducted for the reference head for 280 hours. The results are shown below.

TABLE 15

Case of Φ20 μm nozzle diameter

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | O | O | O | O | O | O |
| S2 | O | O | O | O | O | O |
| S3 | X | X | X | X | X | X |
| S4 | O | O | O | O | O | O |
| S5 | O | O | O | O | O | O |
| S6 | X | X | X | X | X | X |
| S7 | O | O | O | O | O | O |

TABLE 16

Case of Φ15 μm nozzle diameter

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | O | O | O | O | O | O |
| S2 | O | O | O | O | O | O |
| S3 | X | X | X | X | X | X |
| S4 | O | O | O | O | O | O |
| S5 | O | O | O | O | O | O |
| S6 | X | X | X | X | X | X |
| S7 | O | O | O | O | O | O |

TABLE 17

Case of Φ10 μm nozzle diameter

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | O | O | O | O | O | O |
| S2 | O | O | O | O | O | O |
| S3 | X | X | X | X | X | X |
| S4 | O | O | O | O | O | O |
| S5 | O | O | O | O | O | O |
| S6 | X | X | X | X | X | X |
| S7 | O | O | O | O | O | O |

TABLE 18

Case of Φ36 μm nozzle diameter (reference head)

| | Discharge Opening Material Ni | | | Discharge Opening Material SUS304 | | |
|---|---|---|---|---|---|---|
| | Scratch | Pattern Shape | Pattern Performance | Scratch | Pattern Shape | Pattern Performance |
| S1 | O | O | O | O | O | O |
| S2 | O | O | O | O | O | O |
| S3 | X | O | O | X | O | O |
| S4 | O | O | O | O | O | O |
| S5 | O | O | O | O | O | O |
| S6 | X | O | O | X | O | O |
| S7 | O | O | O | O | O | O |

Referring to the evaluation results, in a case that the hardness degree of the included fine particle is greater than the hardness degree of the material of the discharge opening (nozzle) (S3 and S6), it can be known that the discharge opening (nozzle) is damaged. Accordingly, the pattern shape formed by the included fine particles is deteriorated and the pattern performance is deteriorated. Therefore, when the foregoing pattern is formed by the fabrication apparatus according to the present invention, it is required to select a material softer than the discharge opening (nozzle), as the fine particle.

As for the scratch, due to a relationship with the size of the discharge opening (nozzle), there are jet heads which pattern shapes were not deteriorated. Such as the reference head, in a case in that the nozzle diameter is Φ36 μm at least (=approximate 1000 μm² area), even if the discharge opening (nozzle) is scratched, the nozzle diameter is large enough not to deteriorate the jet performance. Thus, a practical pattern shape can be sufficiently obtained. On the other hand, in a case that the nozzle diameter is equal to or less than Φ20 μm (=no more than approximate 314 μm² area), that is, in a case in that the nozzle diameter is equal to or less than ⅓ of the nozzle diameter of the reference head in an area comparison, even if the similar scratch is caused, that influence becomes greater in a comparison of the nozzle diameter. Accordingly, the pattern shape and the pattern performance cannot be properly obtained.

That is, if it is not needed to form such minute pattern, a problem of the scratch does not influence to the pattern performance so that the scratch can be ignored. However, in a case in that a solution containing fine particle having 0.0005 μm through 0.2 μm, 0.5 through 200 nm (more preferably, 0.0005 μm through 0.05 μm, 0.5 through 50 nm) is jetted by a droplet jet head having a nozzle diameter equal to or less than Φ20 μm to thereby form a pattern, a scratch of the discharge opening part (nozzle part) is crucial in the formation of a satisfactory functional pattern. Therefore, the limit value of the size of the nozzle is around Φ20 μm. In other words, in forming a pattern by jetting a solution with a jet head having a nozzle size that is no more than Φ20 μm, it is required to select a combination of a solution and a material for the discharge opening (nozzle) that can prevent the scratch. That is, it is required to select the fine particle softer than members configuring the discharge opening (nozzle).

In the examination, the discharge openings (nozzles) being round and having the Φ20 μm nozzle diameter (approximate 314 μm² area), the Φ15 μm nozzle diameter (approximate 177 μm² area), and the Φ10 μm nozzle diameter (approximate 79 μm² area) are used. Alternatively, in a case in which another shape (for example, a rectangle) is used as the nozzle of the jet head, an area of another shape is compared. For example, since a 18 μm×18 μm area of another shape is similar to a Φ20 μm area of the nozzle being round according to the present invention, such the shape may be applied.

In other words, in a case where the diameter of the discharge opening (nozzle) is no more than Φ20 μm not only applies to a round nozzle. In a case where the nozzle shape is not round, a value corresponding to such area can be applied. For example, a case where the area of the nozzle opening is no more than 314 μm² is included in the range of the present invention even where the nozzle shape is not round. Needless to say, this applies to a case of optimizing the relation between the fine particle diameter Dp and the discharge opening (nozzle) diameter Do for obtaining a stable liquid jet without clogging.

Accordingly, the present invention relates to a technology for forming minute patterns with sizes of few μm to few tens of μm upon wiring pattern substrates and device substrates. However, unlike forming such patterns with conventional techniques as photolithography, the present invention provides an apparatus that can form a wiring pattern or a device by using a jet head with a minute sized nozzle that ejects a droplet of a solution containing fine particles directly onto a substrate. Therefore, with the present invention, no expensive fabrication apparatus used, for example, in semiconductor fabrication processing is required, and wiring pattern substrates and device substrates can be obtained consistently and inexpensively.

Further, the present invention is not limited to these embodiments, but various variations and modifications may be made without departing from the scope of the present invention.

The present application is based on Japanese priority application Nos. 2003-009108, 2003-009186, and 2003-399572 filed on Jan. 17, 2003, Jan. 17, 2003, and Nov. 28, 2003, respectively, with the Japanese Patent Office, the entire contents of which are hereby incorporated by reference.

What is claimed is:

1. A solution jet type fabrication apparatus for fabricating a wiring pattern or a device, the solution jet type fabrication apparatus comprising:
    a holder configured to hold a substrate horizontally to allow a wiring pattern or a device to be formed on said substrate;
    a data input unit for supplying droplet ejection information;
    a jet head for ejecting a droplet of a solution containing conductive fine particles onto the substrate by vaporizing a volatile ingredient of the solution, and allowing a solid component to remain on the substrate, to form the wiring pattern or the device in a forming area of the substrate in accordance with the droplet ejection information supplied by the data input unit; and
    a driving unit that moves at least one of the jet head and the holder relatively to the other,
    wherein the jet head is positioned above the substrate,
    wherein the jet head includes a nozzle from which the droplet is ejected onto said substrate and electrodes to connect each other, the nozzle being formed from a material that has a greater hardness than that of the conductive fine particles in the solution,
    wherein the jet head has a droplet ejecting face for ejecting the droplet, and the droplet ejecting face faces the forming area of the substrate with a distance of 1 mm to 3 mm from the substrate,
    wherein the droplet ejection speed of the jet head is faster than the relative moving speed between the jet head and the substrate,
    wherein the nozzle has a size that is equal to or less than Φ20 μm, each of the conductive fine particles has a size Dp equal to or larger than 0.0005 μm so that the conductive fine particles are dispersed in a stable state, and the size Dp is determined by a relationship Dp/Do≦0.01 so as to prevent clogging of the nozzle, and Do represents a diameter of the nozzle,
    wherein the size $D_p$ is equal to or less than the roughness of a surface of the substrate.

2. The solution jet type fabrication apparatus as claimed in claim 1, wherein the jet head ejects the droplet using a mechanical displacement force.

3. The solution jet type fabrication apparatus as claimed in claim 2, wherein the jet head ejects the droplet using the mechanical displacement force so that the droplet becomes spherical immediately before the droplet reaches the substrate.

4. The solution jet type fabrication apparatus as claimed in claim 2, wherein the jet head ejects the droplet using the mechanical displacement force so that the droplet has an elongated shape along the ejecting direction without a trailing droplet, and so that the length of the elongated droplet in the ejecting direction is no more than three times the length of the elongated droplet in a direction perpendicular to the ejecting direction.

5. The solution jet type fabrication apparatus as claimed in claim 1, wherein the jet head ejects the droplet using a growth displacement force of a thermally generated bubble.

6. The solution jet type fabrication apparatus as claimed in claim 5, wherein the driving unit moves at least one of the jet head and the substrate relatively to the other so that the velocity of the relative movement of the jet head and the substrate is no more than ⅓ of the velocity of the ejected droplet.

7. The solution jet type fabrication apparatus as claimed in claim 5, wherein the jet head ejects the droplet using the growth displacement force of a thermally generated bubble so that the droplet has an elongated shape along the ejecting direction with a trailing droplet, and so that the length of the elongated droplet in the ejecting direction is no less than five times the length of the elongated droplet in a direction perpendicular to the ejecting direction.

8. The solution jet type fabrication apparatus as claimed in claim 1, wherein the jet head includes a filter situated at an upstream location of the nozzle.

9. The solution jet type fabrication apparatus as claimed in claim 8, wherein the filter is situated at a position nearest to the nozzle for trapping a foreign particle with a size equal to or greater than 30 times a diameter of the conductive fine particle.

10. The solution jet type fabrication apparatus as claimed in claim 1, wherein the substrate is made from plastic or polymer film and has no liquid absorbing property, and wherein said electrodes are on said substrate.

11. The solution jet type fabrication apparatus as claimed in claim 1, wherein a thickness of the pattern after vaporizing the volatile ingredient of the solution is from a diameter of the conductive fine particles to 100 μm.

12. The solution jet type fabrication apparatus as claimed in claim 1, wherein a distance between the conductive fine particles in the pattern is within ten times of a diameter of the conductive fine particles.

13. A solution jet type fabrication apparatus for fabricating a wiring pattern or a device, the solution jet type fabrication apparatus comprising:
 a holder configured to hold a substrate horizontally to allow a wiring pattern or a device to be formed on said substrate;
 a data input unit configured to supply droplet ejection information;
 a jet head configured to eject a droplet of a solution containing conductive fine particles onto the substrate by vaporizing a volatile ingredient of the solution and allowing a solid component to remain on the substrate, to form the wiring pattern or the device in a forming area of the substrate in accordance with the droplet ejection information supplied by the data input unit; and
 a driving unit configured to move at least one of the jet head and the holder relatively to the other,
 wherein the jet head includes a nozzle from which the droplet is ejected onto said substrate and electrodes to connect each other, the nozzle has a size that is equal to or less than Φ20 μm, and each of the conductive fine particles has a size Dp equal to or larger than 0.0005 μm so that the conductive fine particles are dispersed in a stable state.

14. A solution jet type fabrication apparatus for fabricating a wiring pattern or a device, the solution jet type fabrication apparatus comprising:
 a holder configured to hold a substrate horizontally to allow a wiring pattern or a device to be formed on said substrate;
 a data input unit configured to supply droplet ejection information;
 a jet head configured to eject a droplet of a solution containing conductive fine particles onto the substrate by vaporizing a volatile ingredient of the solution and allowing a solid component to remain on the substrate, to form the wiring pattern or the device in a forming area of the substrate in accordance with the droplet ejection information supplied by the data input unit; and
 a driving unit configured to move at least one of the jet head and the holder relatively to the other,
 wherein the jet head includes a nozzle from which the droplet is ejected onto said substrate and electrodes to connect each other,
 wherein the nozzle has a size that is equal to or less than Φ20 μm, each of the conductive fine particles has a size Dp equal to or larger than 0.0005 μm so that the conductive fine particles are dispersed in a stable state, and the size Dp of the conductive fine particles is determined by a relationship $Dp/Do \leq 0.01$ so as to prevent clogging of the nozzle, where Do represents a diameter of the nozzle.

* * * * *